United States Patent
Kobayashi et al.

(10) Patent No.: US 12,167,156 B2
(45) Date of Patent: Dec. 10, 2024

(54) CIRCUIT SUBSTRATE, SEMICONDUCTOR APPARATUS, EQUIPMENT, CIRCUIT SUBSTRATE DRIVING METHOD, AND SEMICONDUCTOR APPARATUS MANUFACTURING METHOD

(71) Applicant: CANON KABUSHIKI KAISHA, Tokyo (JP)

(72) Inventors: Hideo Kobayashi, Tokyo (JP); So Hasegawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 17/709,189

(22) Filed: Mar. 30, 2022

(65) Prior Publication Data

US 2022/0321824 A1    Oct. 6, 2022

(30) Foreign Application Priority Data

Apr. 2, 2021 (JP) .................................. 2021-063495

(51) Int. Cl.
*H04N 25/772* (2023.01)
*H01L 27/146* (2006.01)
*H04N 25/75* (2023.01)

(52) U.S. Cl.
CPC ..... *H04N 25/772* (2023.01); *H01L 27/14612* (2013.01); *H01L 27/14634* (2013.01); *H01L 27/1469* (2013.01); *H04N 25/75* (2023.01)

(58) Field of Classification Search
CPC ...... H04N 25/772; H04N 25/75; H04N 25/79; H04N 1/00002; H04N 1/00005; H04N 1/00026; H04N 1/00021; H04N 17/002; H04N 17/02; H01L 27/14612; H01L 27/14634; H01L 27/1469; G01R 31/28; G01R 31/2801; G01R 31/2851; G01R 31/282; G01R 31/2832; G01R 31/3167
See application file for complete search history.

(56) References Cited

U.S. PATENT DOCUMENTS 10,764,526 B1 * 9/2020 Liu ..................... H04N 25/772
2009/0284629 A1   11/2009 Nakao et al.
(Continued)

FOREIGN PATENT DOCUMENTS

JP   2001320021 A   11/2001
JP   2009278236 A   11/2009
(Continued)

*Primary Examiner* — Albert H Cutler
(74) *Attorney, Agent, or Firm* — Canon U.S.A., Inc. IP Division

(57) ABSTRACT

A circuit substrate to be laminated on another substrate includes a plurality of signal lines, a plurality of input portions respectively connected to the plurality of signal lines, and each configured to receive a signal from an outside of the circuit substrate, a plurality of signal processing circuits respectively connected to the plurality of input portions via the plurality of signal lines, and a plurality of transistors configured to supply a predetermined voltage to the plurality of signal lines in a state where no signal is input to the plurality of input portions from the outside. A part of the plurality of transistors is connected to a first control line, and another part of the plurality of transistors is connected to a second control line different from the first control line.

26 Claims, 14 Drawing Sheets

(56) References Cited

U.S. PATENT DOCUMENTS

| | | | |
|---|---|---|---|
| 2012/0119063 A1* | 5/2012 | Takamiya | H04N 17/002 |
| | | | 250/208.1 |
| 2015/0341582 A1 | 11/2015 | Sakaguchi | |
| 2019/0174080 A1* | 6/2019 | Kaibara | H04N 25/76 |
| 2020/0059620 A1* | 2/2020 | Shimizu | H04N 25/76 |
| 2020/0091205 A1* | 3/2020 | Shinohara | H01L 31/11 |
| 2020/0366860 A1* | 11/2020 | Shishido | H01L 27/14612 |
| 2022/0094907 A1* | 3/2022 | Suto | H04N 25/79 |

FOREIGN PATENT DOCUMENTS

| | | | |
|---|---|---|---|
| JP | 2014154975 A | 8/2014 | |
| JP | 2019068271 A | 4/2019 | |
| WO | 2015/151793 A1 | 10/2015 | |

\* cited by examiner

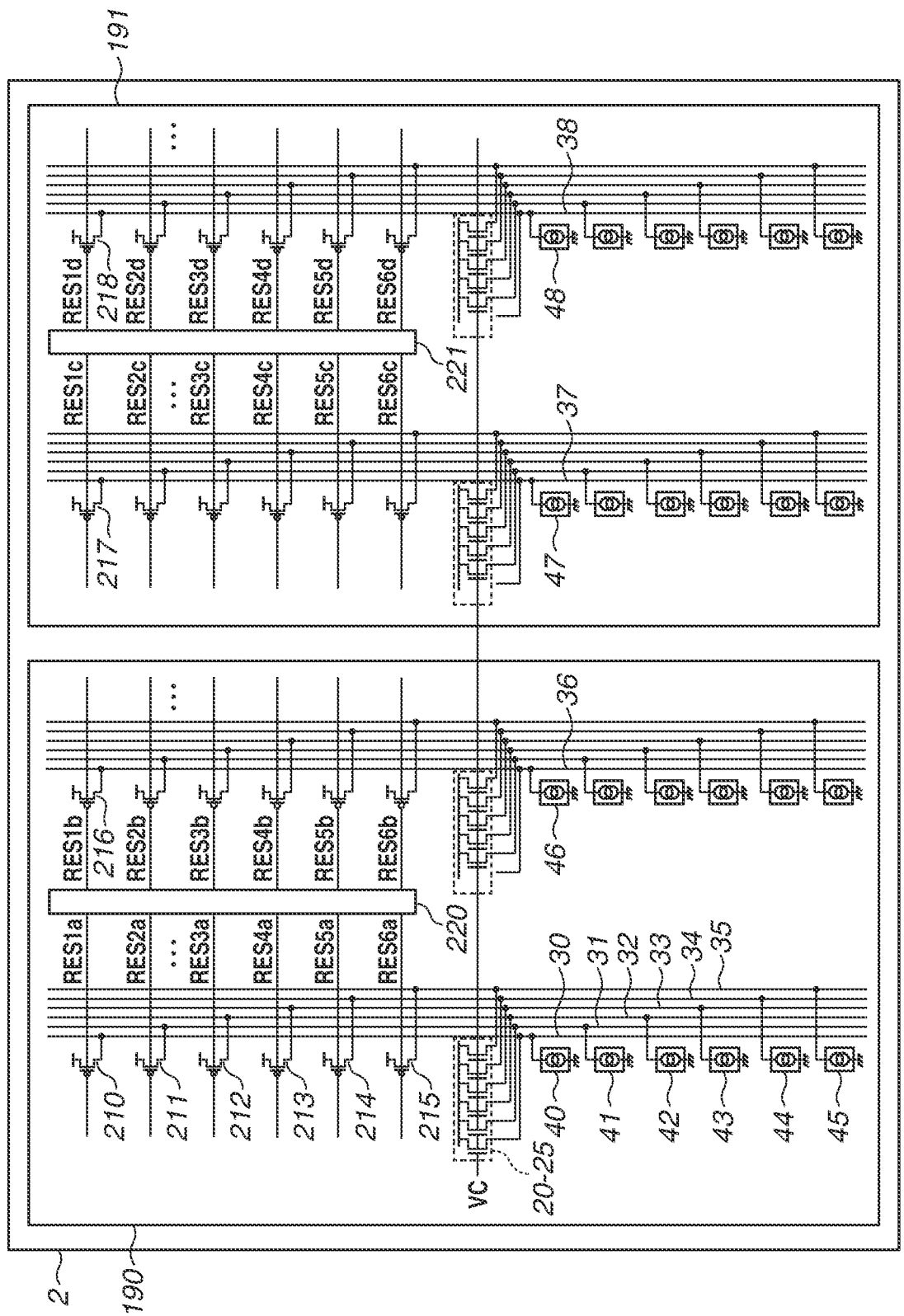

CIRCUIT SUBSTRATE, SEMICONDUCTOR APPARATUS, EQUIPMENT, CIRCUIT SUBSTRATE DRIVING METHOD, AND SEMICONDUCTOR APPARATUS MANUFACTURING METHOD

BACKGROUND

Field of the Disclosure

The present disclosure relates to a circuit substrate, a semiconductor apparatus, equipment, a circuit substrate driving method, and a semiconductor apparatus manufacturing method.

Description of the Related Art

In semiconductor fields such as memories and image sensors, a semiconductor apparatus in which a plurality of substrates is laminated is known.

Examples of the semiconductor apparatus in which the plurality of substrates is laminated include a lamination type photoelectric conversion apparatus. As a configuration example of the photoelectric conversion apparatus, a configuration discussed in Japanese Patent Application Laid-Open No. 2019-68271 is known. In this configuration, a signal processing circuit that processes signals output from pixels is provided on a circuit substrate to be laminated on a pixel substrate on which the pixels each including a photoelectric conversion unit are provided.

International Publication No. WO 2015/151793 discusses a configuration in which a predetermined voltage is supplied to a plurality of signal lines respectively connected to a plurality of signal processing circuits.

In a case where an inspection is conducted after a plurality of substrates is laminated, even if one of the substrates has a defect (e.g., a failure or a characteristic defect), another normal substrate is laminated on the defective substrate before the defect is detected. As a result, not only the defective substrate, but also the other normal substrate laminated on the defective substrate are rejected for shipment, or a process for separating the substrates is required. This leads to a decrease in the yield of the semiconductor apparatus.

Such an issue is not considered in the configurations discussed in Japanese Patent Application Laid-Open No. 2019-68271 and International Publication No. WO 2015/151793.

SUMMARY OF THE DISCLOSURE

According to an aspect of the present disclosure, a circuit substrate to be laminated on another substrate includes a plurality of signal lines, a plurality of input portions respectively connected to the plurality of signal lines, and each configured to receive a signal from an outside of the circuit substrate, a plurality of signal processing circuits respectively connected to the plurality of input portions via the plurality of signal lines, and a plurality of transistors configured to supply a predetermined voltage to the plurality of signal lines in a state where no signal is input to the plurality of input portions from the outside. A part of the plurality of transistors is connected to a first control line, and another part of the plurality of transistors is connected to a second control line different from the first control line.

In other embodiment, each of the plurality of signal processing circuits includes an analog-to-digital (AD) conversion unit configured to convert the predetermined voltage supplied from a corresponding one of the plurality of transistors into a digital signal.

Furthermore, the digital signal generated by each of the plurality of signal processing circuits is output to the outside of the circuit substrate. In addition, the circuit substrate may further comprise a circuit configured to compare the digital signal with an expected value.

In additional embodiment, the circuit outputs, to the outside of the circuit substrate, a signal indicating that a difference between the digital signal and the expected value is detected as being greater than a predetermined amount.

In additional embodiment, the circuit substrate power supply voltage is supplied to one of main nodes of each of the plurality of transistors, and the plurality of transistors serves as switches configured to switch between supplying and not supplying, to the plurality of signal lines, the predetermined voltage based on the power supply voltage.

In other embodiments, the circuit substrate further comprises a plurality of current sources respectively connected to the plurality of signal lines, wherein each of the plurality of transistors is configured to perform a source follower operation with a corresponding one of the plurality of current sources.

In yet additional embodiments, the circuit substrate further comprises: a plurality of current sources respectively connected to the plurality of signal lines; and a plurality of second transistors each configured to switch a conductive state and a non-conductive state of an electrical path between a corresponding one of the plurality of input portions and a corresponding one of the plurality of signal processing circuits, the plurality of second transistors being respectively connected to the plurality of signals lines, wherein one node of each of the plurality of second transistors is connected to a corresponding one of the plurality of transistors and a corresponding one of the plurality of current sources, and wherein another node of each of the plurality of second transistors is connected to the corresponding one of the plurality of signal processing circuits.

In additional embodiment, the circuit substrate further comprises a plurality of second transistors each configured to switch a conductive state and a non-conductive state of an electrical path between a corresponding one of the plurality of input portions and a corresponding one of the plurality of signal processing circuits, the plurality of second transistors being respectively connected to the plurality of signals lines, wherein one node of each of the plurality of second transistors is connected to a corresponding one of the plurality of transistors and a corresponding one of the plurality of current sources, and wherein another node of each of the plurality of second transistors is connected to the corresponding one of the plurality of signal processing circuits.

Additionally, the circuit substrate may further comprise a plurality of third transistors respectively connected to the plurality of signal lines, and each configured to switch between supplying and not supplying a second voltage different from the predetermined voltage, wherein each of the plurality of transistors is a transistor of a first conductivity type, and wherein each of the plurality of third transistors is a transistor of a second conductivity type different from the first conductivity type.

Furthermore, the circuit substrate may teach: wherein signals output from a plurality of pixels each including a photoelectric conversion unit are input to the plurality of input portions, the plurality of pixels being arranged in a plurality of rows and a plurality of columns on the other substrate, and wherein at least two of the plurality of input portions are provided corresponding to pixels in one of the plurality of columns.

In additional embodiments, each of the plurality of signal processing circuits includes a waveform shaping circuit and a counter that are configured to process a signal output from an avalanche photodiode provided on the other substrate.

In further embodiments, the circuit substrate is manufactured by a manufacturing apparatus different from a manufacturing apparatus for the other substrate.

The subject innovation further teaches the circuit substrate present above, wherein the circuit substrate and the other substrate are laminated.

Furthermore, equipment comprises a semiconductor apparatus including the circuit substrate, and further comprises at least one of: an optical apparatus corresponding to the semiconductor apparatus; a control apparatus configured to control the semiconductor apparatus; a processing apparatus configured to process a signal output from the semiconductor apparatus; a display apparatus configured to display information obtained by the semiconductor apparatus; a storage apparatus configured to store the information obtained by the semiconductor apparatus; or a mechanical apparatus configured to operate based on the information obtained by the semiconductor apparatus.

In addition, the subject innovation also teaches a method for driving a circuit substrate to be laminated on another substrate, wherein the circuit substrate includes: a plurality of signal lines; a plurality of input portions respectively connected to the plurality of signal lines, and each configured to receive a signal from an outside of the circuit substrate; a plurality of signal processing circuits respectively connected to the plurality of input portions via the plurality of signal lines; and a plurality of transistors, wherein a part of the plurality of transistors is connected to a first control line, and another part of the plurality of transistors is connected to a second control line different from the first control line, and wherein the method comprising supplying, by the plurality of transistors, a predetermined voltage to the plurality of signal lines in a state where no signal is input to the plurality of input portions from the outside.

Finally, the subject innovation includes a method for manufacturing a semiconductor apparatus in which a circuit substrate is laminated on another substrate different from the circuit substrate, wherein the circuit substrate includes: a plurality of signal lines; a plurality of input portions respectively connected to the plurality of signal lines, and each configured to receive a signal from an outside of the circuit substrate; a plurality of signal processing circuits respectively connected to the plurality of input portions via the plurality of signal lines; and a plurality of transistors, wherein a part of the plurality of transistors is connected to a first control line, and another part of the plurality of transistors is connected to a second control line different from the first control line, the method comprising: supplying, using the plurality of transistors, a predetermined voltage to the plurality of signal lines in a state where no signal is input to the plurality of input portions from the outside; processing, using the plurality of signal processing circuits, the predetermined voltage; and laminating the circuit substrate and the other substrate after the processing.

Further features of the present disclosure will become apparent from the following description of exemplary embodiments with reference to the attached drawings.

BRIEF DESCRIPTION OF THE DRAWINGS

FIG. 13 is a circuit diagram illustrating a configuration of a photoelectric conversion apparatus according to a sixth exemplary embodiment.

DESCRIPTION OF THE EMBODIMENTS

Figure 1:
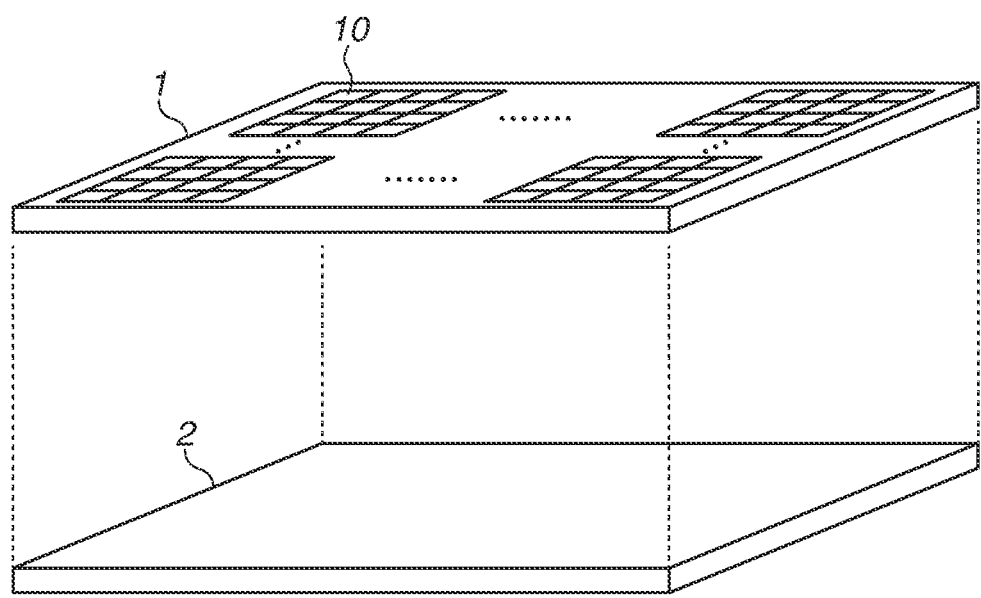
FIG. 1 is a diagram illustrating a configuration of a photoelectric conversion apparatus according to a first exemplary embodiment.

In each of the following exemplary embodiments, a photoelectric conversion apparatus will be described as an application example of a circuit substrate. In particular, an image capturing apparatus will be mainly described as an example of the photoelectric conversion apparatus. However, the exemplary embodiments are not limited to the image capturing apparatus, but are also applicable to other examples of the photoelectric conversion apparatus. Other examples of the photoelectric conversion apparatus include a distance measurement apparatus (an apparatus for measuring a distance using focus detection or Time-Of-Flight (TOF)) and a photometry apparatus (an apparatus for measuring an incident light amount). Application examples of the circuit substrate according to each of the exemplary embodiments include not only the photoelectric conversion apparatus, but also various semiconductor apparatuses such as a memory (e.g., a dynamic random access memory (DRAM)) and a light-emitting device.

In the following description, a substrate is assumed to include not only a semiconductor layer, but also an interlayer insulating film and a wiring layer formed above the semiconductor layer.

The conductivity type of a transistor to be described in the following exemplary embodiments is a mere example, and the exemplary embodiments are not limited to the conductivity type described in the exemplary embodiments. The conductivity type can be appropriately changed from the conductivity type described in the exemplary embodiments, and with the change, the potentials of the gate, source, and drain of the transistor are appropriately changed.

For example, in the case of a transistor to be operated as a switch, with the change of the conductivity type, the low-level and high-level potentials to be supplied to the gate of the transistor, which are described in the exemplary embodiments, are to be reversed. In addition, the conductivity type of a semiconductor region to be described in the following exemplary embodiments is a mere example, and the exemplary embodiments are not limited to the conductivity type described in the exemplary embodiments. The conductivity type can be appropriately changed from the conductivity type described in the exemplary embodiments, and with the change, the potential of the semiconductor region is appropriately changed.

Typically, a metal-oxide semiconductor (MOS) transistor can be used as a transistor described in the following exemplary embodiments, but other types of transistors can also be used. For example, a thin-film transistor may also be used.

In the following exemplary embodiments, a connection between circuit elements is described. Unless otherwise specified, the elements of interest are described to be connected to each other even in a case where another element is interposed between the elements of interest. For example, assume that an element A is connected to one node of a capacitor element C including a plurality of nodes and an element B is connected to another node of the capacitor element C. Also in this case, unless otherwise specified, the elements A and B are described to be connected to each other.

A first exemplary embodiment of the present disclosure will be described below with reference to FIGS. 1 to 4.

FIG. 1 illustrates a first substrate 1 and a second substrate 2 that are included in a photoelectric conversion apparatus according to the present exemplary embodiment. The first substrate 1 is a pixel substrate (a pixel chip) on which a plurality of pixels 10 is arranged in a plurality of rows and a plurality of columns. The second substrate 2 is a circuit substrate (a circuit chip) on which a plurality of signal processing circuits is arranged. Although FIG. 1 illustrates only the pixels 10 arranged on the first substrate 1, control lines for controlling the pixels 10 and signal lines for transmitting signals output from the pixels 10 are also arranged on the first substrate 1. In addition, drive circuits, such as a vertical scanning circuit and a timing generator, are arranged, as appropriate, on the first substrate 1 or the second substrate 2. The plurality of signal processing circuits is arranged on the second substrate 2.

Figure 2:
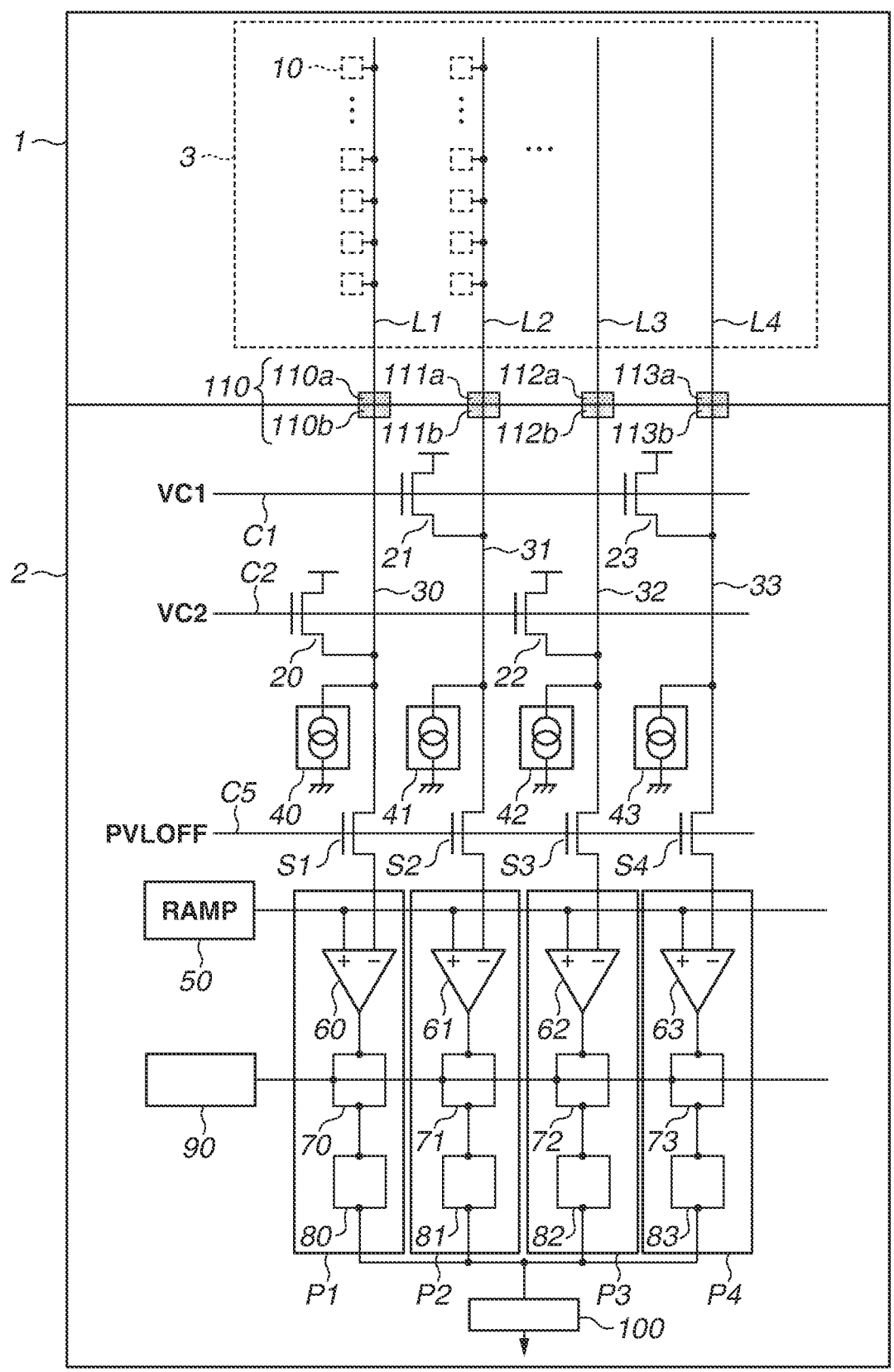
FIG. 2 is a circuit diagram illustrating the configuration of the photoelectric conversion apparatus according to the first exemplary embodiment.

FIG. 2 is a circuit diagram illustrating a configuration of the photoelectric conversion apparatus illustrated in FIG. 1.

The first substrate 1 includes a pixel array 3 including the pixels 10 arranged in a plurality of rows and a plurality of columns, and pixel signal lines L1 to L4. The pixel signal line L1 is connected to a bonding portion 110a provided on the first substrate 1. Similarly, the pixel signal lines L2 to L4 are connected to bonding portions 111a, 112a, and 113a provided on the first substrate 1, respectively. Typically, the pixel array 3 includes thousands of rows and columns of the pixels 10. FIG. 2 illustrates a part of the pixels 10.

Figure 3:
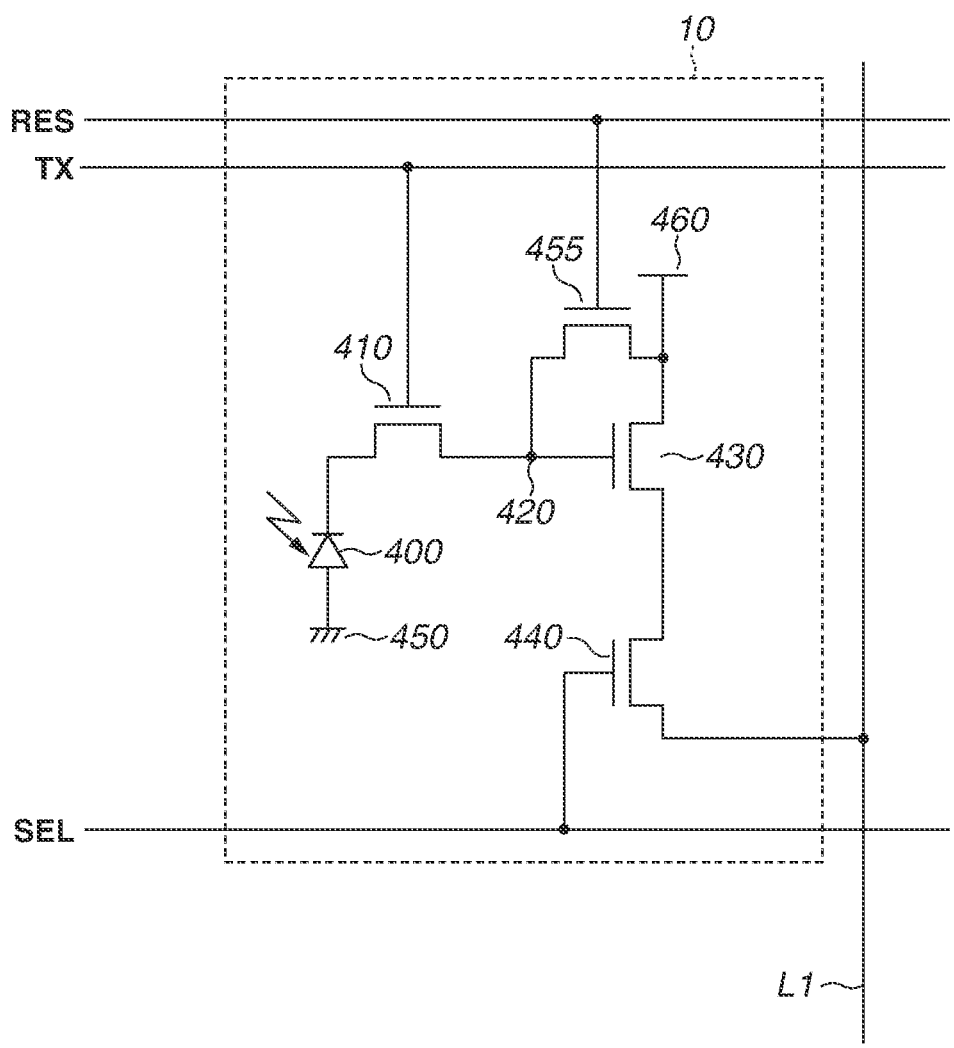
FIG. 3 is a circuit diagram illustrating a configuration of a pixel according to the first exemplary embodiment.

A configuration of each of the pixels 10 will be described with reference to FIG. 3. FIG. 3 illustrates a circuit example of each of the pixels 10. Referring to FIG. 3, each of the pixels 10 includes a power supply terminal 460, a ground (GND) terminal 450, and a reset transistor 455. Photocarrier generated in a photodiode 400 serving as a photoelectric conversion unit is transferred to a floating diffusion 420 when a transfer transistor 410 is turned on, and the photocarrier is converted into a signal voltage with a parasitic capacitance coupled to the floating diffusion 420. The signal voltage is output to a corresponding one of the pixel signal lines L1 to L4 (the pixel signal line L1 in FIG. 3) through an amplification transistor (a source follower transistor) 430 and a selection transistor 440. The amplification transistor 430 and a current source 40 (refer to FIG. 2) form a source follower. The signal voltage on the floating diffusion 420 is buffered by the source follower and is output to the pixel signal line L1.

Referring again to FIG. 2, the configuration of the photoelectric conversion apparatus will be described in more detail.

The bonding portion 110a is bonded to a bonding portion 110b provided on the second substrate 2. The first substrate 1 and the second substrate 2 are bonded together in a state where the first substrate 1 is located above the second substrate 2 and the second substrate 2 is located below the first substrate 1 as viewed from a light incidence surface. The first substrate 1 and the second substrate 2 are electrically connected by bonding the bonding portions 110a and 110b. The electrical connection can be established by using a Through Silicon Via (TSV) structure. As another connection method, hybrid bonding can be used. In hybrid bonding, the bonding surface of each of the first substrate 1 and the second substrate 2 is provided with an insulating film and a conductive member formed in a groove of the insulating film, and the insulating films are bonded together and the conductive members are bonded together. Typically, each of the conductive members is mainly made of copper. Each of the insulating films may be a single-layer film made of one of silicon nitride, silicon oxide, silicon oxynitride, silicon carbide, and silicon oxycarbide, or a multi-layer film formed by combining a plurality of these. The electrical connection between the first substrate 1 and the second substrate 2 is not limited thereto. Micro bumps may be used and various connection methods may be employed.

Similarly, the bonding portions 111a, 112a, and 113a are connected to bonding portions 111b, 112b, and 113b provided on the second substrate 2, respectively. To collectively denote the bonding portions of the first substrate 1 and the second substrate 2 to be bonded together, the symbols "a" and "b" added to the ends of the reference numerals will be omitted. For example, as illustrated in FIG. 2, the bonding portions 110a and 110b to be bonded together will be collectively referred to as a bonding portion 110. The same applies to the other bonding portions.

The second substrate 2 includes signal lines 30 to 33 that are connected to the bonding portions 110b, 111b, 112b, and 113b, respectively. The bonding portions 110b, 111b, 112b, and 113b are a plurality of input portions configured to receive signals from an outside of the second substrate 2 serving as the circuit substrate. In the example of FIG. 2, the signals input from the outside are pixel signals output from the pixels 10.

The signal lines 30 to 33 are connected to current sources 40 to 43, respectively. The current sources 40 to 43 supply a current to the signal lines 30 to 33, respectively. The current sources 40 to 43 also supply a current to the pixels 10 via the bonding portions 110 to 113 and the pixel signal lines L1 to L4 on the first substrate 1, respectively. The current sources 40 to 43 supply the current to the amplification transistor 430 provided in each of the pixels 10. Thus, as described above, each of the current sources 40 to 43 and the amplification transistor 430 provided in each of the pixels 10 forms a source follower circuit.

The signal lines 30 to 33 are also connected to n-type transistors 20 to 23, respectively. Each of the n-type transistors 20 to 23 can be operated as a switch. Similarly to the amplification transistor 430 in each of the pixels 10, if the n-type transistors 20 to 23 are operated with the current sources 40 to 43, respectively, the n-type transistors 20 to 23 can also function as source follower transistors.

The gate of each of the n-type transistors 21 and 23 is connected to a control line C1 for transmitting a signal VC1. The gate of each of the n-type transistors 20 and 22 is connected to a control line C2 for transmitting a signal VC2. While FIG. 2 illustrates a configuration where the two control lines C1 and C2 are provided, a configuration where a single control line is shared may be used. Also in this configuration, an inspection can be conducted to determine whether signal processing circuits P1 to P4 are in a normal state. One of main nodes of each of the n-type transistors 20 to 23, i.e., the source or the drain is connected to a power supply voltage supply node, and the other of the main nodes of each of the n-type transistors 20 to 23, i.e., the source or the drain is connected to the corresponding one of the signal lines 30 to 33. The n-type transistors 20 to 23 are a plurality of transistors that supply a predetermined voltage (a test voltage) to the signal lines 30 to 33. In other words, in a case where the n-type transistors 20 to 23 operate as switches, the n-type transistors 20 to 23 are a plurality of transistors configured to switch between supplying and not supplying the predetermined voltage. The predetermined voltage to be supplied from the n-type transistors 20 to 23 is a voltage that is decreased by the amount corresponding to a threshold voltage of the n-type transistors 20 to 23 from the power supply voltage to be supplied to one of the main nodes of each of the n-type transistors 20 to 23. In addition, a voltage different from the power supply voltage to be supplied to one of the main nodes of each of the n-type transistors 20 to 23 can be supplied to the signal lines 30 to 33, using various resistance components and capacitance components, such as on-resistance of the n-type transistors 20 to 23.

In a case where the n-type transistors 20 to 23 operate as switches, a reference voltage based on which the predetermined voltage is supplied to the signal lines 30 to 33 is the power supply voltage to be supplied to one of the main nodes of each of the n-type transistors 20 to 23.

In a case where the n-type transistors 20 to 23 operate as source follower transistors, the predetermined voltage based on the potential of the signal VC1 or VC2 is output to each of the signal lines 30 to 33 as a source follower operation. In this case, the potential of each of the signals VC1 and VC2 corresponds to the reference voltage based on which the value of the predetermined voltage is determined.

The signal lines 30 to 33 are connected to transistors S1 to S4, respectively. One of main nodes of the transistor S1 is connected to each of the current source 40, the n-type transistor 20, and the bonding portion 110, and the other of the main nodes of the transistor S1 is connected to a comparator 60. Similarly, one of main nodes of each of the transistors S2 to S4 is connected to the corresponding one of the current sources 41 to 43, the corresponding one of the n-type transistors 21 to 23, and the corresponding one of the bonding portions 111 to 113. The other of the main nodes of each of the transistors S2 to S4 is connected to a corresponding one of comparators 61 to 63. Each of the transistors S1 to S4 operates as a switch for switching a conductive state and a non-conductive state of an electrical path between the corresponding one of the plurality of input portions (bonding portions) 110b to 113b and the corresponding one of the signal processing circuits P1 to P4. The switch is turned on or off based on a timing when signals are read out from the pixels 10 after the first substrate 1 and the second substrate 2 are laminated. Typically, the transistors S1 to S4 are controlled to be turned off during a period in which an electric charge is transferred from the photodiode 400 to the floating diffusion 420 when the transfer transistor 410 in each of the pixels 10 is turned on. After the state of the transfer transistor 410 is changed from the on state to the off state, the transistors S1 to S4 are turned on, so that the signals output from the pixels 10 are input to the corresponding one of the signal processing circuits P1 to P4.

The second substrate 2 includes the plurality of signal processing circuits P1 to P4. The signal processing circuit P1 includes the comparator 60, a first memory 70, and a second memory 80. Similarly, the signal processing circuit P2 includes the comparator 61, a first memory 71, and a second memory 81. The signal processing circuit P3 includes the comparator 62, a first memory 72, and a second memory 82. The signal processing circuit P4 includes the comparator 63, a first memory 73, and a second memory 83.

The second substrate 2 also includes a ramp signal supply circuit 50. The ramp signal supply circuit 50 supplies a ramp signal to each of the comparators 60 to 63. The ramp signal has a voltage that increases or decreases with time. The change in the voltage may not necessarily be constant, and the amount of change in the voltage may be variable. The change in the voltage is not limited to a slope waveform, but may be a step-like change.

The second substrate 2 also includes a counter 90. The counter 90 generates a count signal by measuring the number of clock signals to be supplied. The count signal is supplied to each of the first memories 70 to 73. The first memories 70 to 73 hold the count signal corresponding to a timing when the output signal of the corresponding one of the comparators 60 to 63 changes. The count signal is a digital signal corresponding to an input signal (an analog signal). Thus, each of the signal processing circuits P1 to P4 can perform an analog-to-digital (AD) conversion for converting the input signal into the digital signal. In other words, each of the signal processing circuits P1 to P4 is an AD conversion unit that converts the input signal (including the predetermined voltage supplied from the corresponding one of the n-type transistors 20 to 23) into the digital signal.

The digital signal held in the first memory 70 is transferred to the second memory 80, and then output to the outside of the chip via an output circuit 100. While in the present exemplary embodiment, an example where the counter 90 is shared among the plurality of signal processing circuits P1 to P4 is described, the present exemplary embodiment can also be applied to a configuration in which a common count clock is supplied to the plurality of signal processing circuits P1 to P4, and each of the signal processing circuits P1 to P4 respectively corresponding to the signal lines 30 to 33 is provided with a counter.

In the present exemplary embodiment, the n-type transistors 20 to 23 are provided on the second substrate 2. The n-type transistors 20 to 23 can be controlled by using the signals VC1 and VC2 even before the second substrate 2 and the first substrate 1 are laminated. In other words, the n-type transistors 20 to 23 can supply the predetermined voltage to the signal lines 30 to 33, respectively, in a state where no signal is input to the plurality of input portions (bonding portions) 110b to 113b. The signals VC1 and VC2 can be supplied from a control circuit provided in the second substrate 2. In another example, respective input pads that receive the signals VC1 and VC2 may be provided on the second substrate 2 or the first substrate 1 so that the signals VC1 and VC2 can be supplied from the outside.

When the signals VC1 and VC2 are at a high level, the n-type transistors 20 to 23 are turned on and the predetermined voltage is supplied to the signal lines 30 to 33. The predetermined voltage is input to the signal processing circuits P1 to P4 via the signal lines 30 to 33, respectively. Each of the signal processing circuits P1 to P4 converts the input predetermined voltage into a digital signal, as in the AD conversion on the pixel signals. At this time, if disconnection occurs in the signal lines 30 to 33, or if a failure or a characteristic defect occurs in the signal processing circuits P1 to P4, the digital signal cannot be generated, or the digital signal of an expected value cannot be generated. Thus, the second substrate 2 can be inspected based on whether the digital signal is output from each of the signal processing circuits P1 to P4, or whether a difference between the output digital signal and the expected value is smaller than a predetermined amount. Accordingly, the second substrate 2 can be inspected alone before the first substrate 1 and the second substrate 2 are laminated. In a case where an inspection is conducted after the first substrate 1 and the second substrate 2 are laminated without the second substrate 2 being inspected alone, the following issue arises if the second substrate 2 is defective. A loss occurs in man-hour associated with the process of laminating the defective second substrate 2 on the first substrate 1, which leads to a decrease in the yield of the photoelectric conversion apparatus. A loss in cost associated with the process also occurs. If the first substrate 1 is normal, the normal first substrate 1 is to be lost. This leads to a decrease in the yield of the photoelectric conversion apparatus. It is difficult to separate the first substrate 1 and the second substrate 2 after lamination of the first substrate 1 and the second substrate 2, because the separation may damage the bonding portions. Even if the first substrate 1 and the second substrate 2 are separated from each other, a loss occurs due to an increase in the number of processes, which leads to a decrease in the yield of the photoelectric conversion apparatus. In the inspection to be conducted after the first substrate 1 and the second substrate 2 are laminated, it may be difficult to identify which one of the first substrate 1 and the second substrate 2 is defective. As a result, feedback about the inspection result is not appropriately given to a manufacturing apparatus for manufacturing the photoelectric conversion apparatus, which makes it difficult to improve the yield of the photoelectric conversion apparatus.

In the present exemplary embodiment, the second substrate 2 is inspected alone. This makes it possible to detect a detect in the second substrate 2 before laminating the first substrate 1 and the second substrate 2. As a result, it is possible to reduce man-hour and a loss of cost associated with the process of laminating the first substrate 1 and the defective second substrate 2. It is also possible to reduce a loss of the normal first substrate 1, which leads to an improvement in the yield of the photoelectric conversion apparatus. In the inspection to be conducted after the first substrate 1 and the second substrate 2 are laminated, it may be difficult to identify which one of the first substrate 1 and the second substrate 2 is defective. The configuration in which the second substrate 2 is inspected alone makes it possible to identify which one of the first substrate 1 and the second substrate 2 is defective. If a defect is detected in the second substrate 2 in inspecting the second substrate 2 alone, the inspection result can be fed back to the manufacturing apparatus for manufacturing the second substrate 2. In addition, in a case where a defect is detected in the photoelectric conversion apparatus using the second substrate 2 that has passed the unit inspection of the second substrate 2, it is possible to easily narrow down the location where the defect has occurred. More specifically, it can be determined whether the defect has occurred in the first substrate 1 or in the bonding portions between the first substrate 1 and the second substrate 2. Thus, the inspection result can be immediately fed back to the manufacturing apparatus for manufacturing the first substrate 1 or the manufacturing apparatus for bonding the first substrate 1 and the second substrate 2. As a result, an advantageous effect of improving the yield of the photoelectric conversion apparatus can be obtained.

As described above, in a case where the manufacturing apparatus for manufacturing the first substrate 1 is different from the manufacturing apparatus for manufacturing the second substrate 2, the technique according to the present exemplary embodiment is particularly effective. In many cases, the process rule of the manufacturing apparatus for manufacturing the first substrate 1 is different from that of the manufacturing apparatus for manufacturing the second substrate 2. In particular, the manufacturing apparatus for manufacturing the second substrate 2 uses a finer process rule than the process rule of the manufacturing apparatus for manufacturing the first substrate 1. In this case, a defect is more likely to occur in the second substrate 2 than in the first substrate 1. For this reason, the configuration capable of inspecting the second substrate 2 alone is effective.

While the advantageous effects on the photoelectric conversion apparatus are manly described in the present exemplary embodiment, the advantageous effects of the present exemplary embodiment can also be obtained in semiconductor apparatuses, such as storage elements, including memories, and light-emitting devices, in which a plurality of substrates is laminated.

In the present exemplary embodiment, the two control lines C1 and C2 are provided as the control lines for controlling the n-type transistors 20 to 23. Even in a case where a single common control line is used, the configuration described above is effective in that whether the signal processing circuits P1 to P4 operate normally can be inspected. An operation using the two control lines C1 and C2 illustrated in FIG. 2 and other advantageous effects obtained in the operation will be described below.

Figure 4:
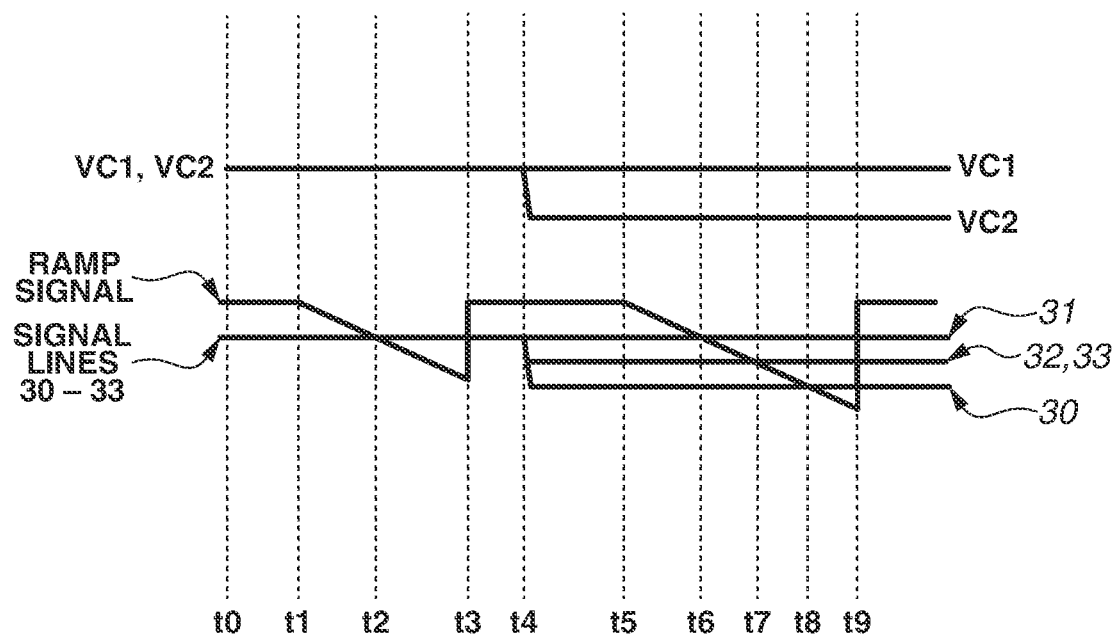
FIG. 4 is a timing diagram illustrating an operation of a second substrate according to the first exemplary embodiment.

An inspection for a short-circuit between the signal lines 30 to 33 will be described with reference to FIG. 4. The following description is based on the assumption that the n-type transistors 20 to 23 and the current sources 40 to 43 form source followers, respectively.

At time t0, the signal VC1 and the signal VC2 have the same potential. The voltage based on the signal VC1 and the signal VC2 appears on the signal lines 30 to 33.

At time t1, the ramp signal starts a slope operation. At time t2, the voltage of the ramp signal input to each of the comparators 60 to 63 is equal to the voltage of the signal on each of the signal lines 30 to 33, so that the output of each of the comparators 60 to 63 changes. Based on the change in the output of each of the comparators 60 to 63, the first memories 70 to 73 hold the count signal corresponding to the timing of the change. The count signal has a value corresponding to a length of a period from when the slop operation of the ramp signal is started to when the output of each of the comparators 60 to 63 changes. Accordingly, the AD conversion is performed on a reference level of the signal VC1 and the signal VC2. After that, at time t3, the ramp signal is reset.

At time t4, the voltage of one of the signal VC1 and the signal VC2, i.e., the voltage of the signal VC2, is decreased. Consider a case where a short-circuit defect has occurred between the signal line 32 and the signal line 33. The potential of the signal VC1 is not changed. Thus, the potential of the signal line 31 does not change and the potential of the signal line 30 changes depending on the amount of change in the signal VC2, whereas the signal lines 32 and 33 in which the short-circuit defect has occurred are at an intermediate level between the levels of the signal line 30 and the signal line 31.

At time t5, the ramp signal starts the slope operation again.

At time t6, the output of the comparator 61 changes. At time 17, the output of each of the comparators 62 and 63 changes. At time t8, the output of the comparator 60 changes. Each of the first memories 70 to 73 holds the count signal corresponding to the timing when the output of the corresponding one of the comparators 60 to 63 changes.

Then, a signal corresponding to a difference from the AD conversion result on the reference level obtained at time t2 is generated. The signal corresponding to the difference may be generated in the output circuit 100, or may be generated in each of the signal processing circuits P1 to P4. The signal is referred to as a generated signal. The generated signal is obtained as a result of processing the predetermined voltage in each of the plurality of signal processing circuits P1 to P4. The output circuit 100 compares the generated signal with an expected value. When a difference between the generated signal and the expected value is greater than a predetermined amount, the output circuit 100 outputs the detection result to the outside of the second substrate 2. This configuration makes it possible to detect a defect in the second substrate 2.

The generated signal generated by each of the signal processing circuits P3 and P4 connected to the signal line 32 and the signal line 33, respectively, is different from the expected value. As a result, the short-circuit defect between the signal lines 32 and 33 can be detected.

The comparison between the generated signal and the expected value may be performed outside the second substrate 2.

The operation described above makes it possible to detect a short-circuit defect between the plurality of signal lines 30 to 33. While the operation has been described focusing on a short-circuit defect between the plurality of signal lines 30 to 33, a short-circuit defect between the first memories 70 to 73 or a short-circuit defect between the second memories 80 to 83 can also be detected. It is also possible to detect whether each of the signal processing circuits P1 to P4 operates normally. It is further possible to inspect whether the change timing of the output of each of the comparators 60 to 63 deviates from a predetermined range, whether a writing defect has occurred in the first memories 70 to 73 and the second memories 80 to 83, and whether a transmission defect has occurred between the first memories 70 to 73 and the second memories 80 to 83, respectively. Although not illustrated in FIG. 2, a horizontal scanning circuit for sequentially reading out the digital signals from the second memories 80 to 83 on a column-by-column basis may be provided. In this case, it is also possible to inspect whether the horizontal scanning circuit operates normally and whether a transmission path from the second memories 80 to 83 to the output circuit 100 is in a normal state.

As described above, according to the present exemplary embodiment, it is possible to inspect (evaluate) the second substrate 2 alone. This leads to an improvement in the yield of the semiconductor apparatus. In addition, the control line C1 for controlling a part of the plurality of n-type transistors 20 to 23 (i.e., the n-type transistors 21 and 23) is different from the control line C2 for controlling the other part of the plurality of n-type transistors 20 to 23 (the n-type transistors 20 and 22), which makes it possible to conduct an inspection for a short-circuit defect.

The present exemplary embodiment is not limited to the circuit configuration illustrated in FIG. 2, and a capacitor element and a resistor element may also be provided as appropriate. For example, a configuration where a clamp capacitor element is provided between the transistor S1 and the comparator 60 may be used. Also in this configuration, it can be said that the transistor S1 and the comparator 60 are connected.

While in the present exemplary embodiment, the configuration in which two substrates (the first substrate 1 and the second substrate 2) are laminated has been described, another substrate may be further laminated.

In the present exemplary embodiment, the evaluation is made based on whether the difference between the generated signal and the expected value is smaller than the predetermined amount. Alternatively, the evaluation may be made based on whether the difference is larger than the predetermined amount, or whether the generated signal matches the expected value.

Figure 5:
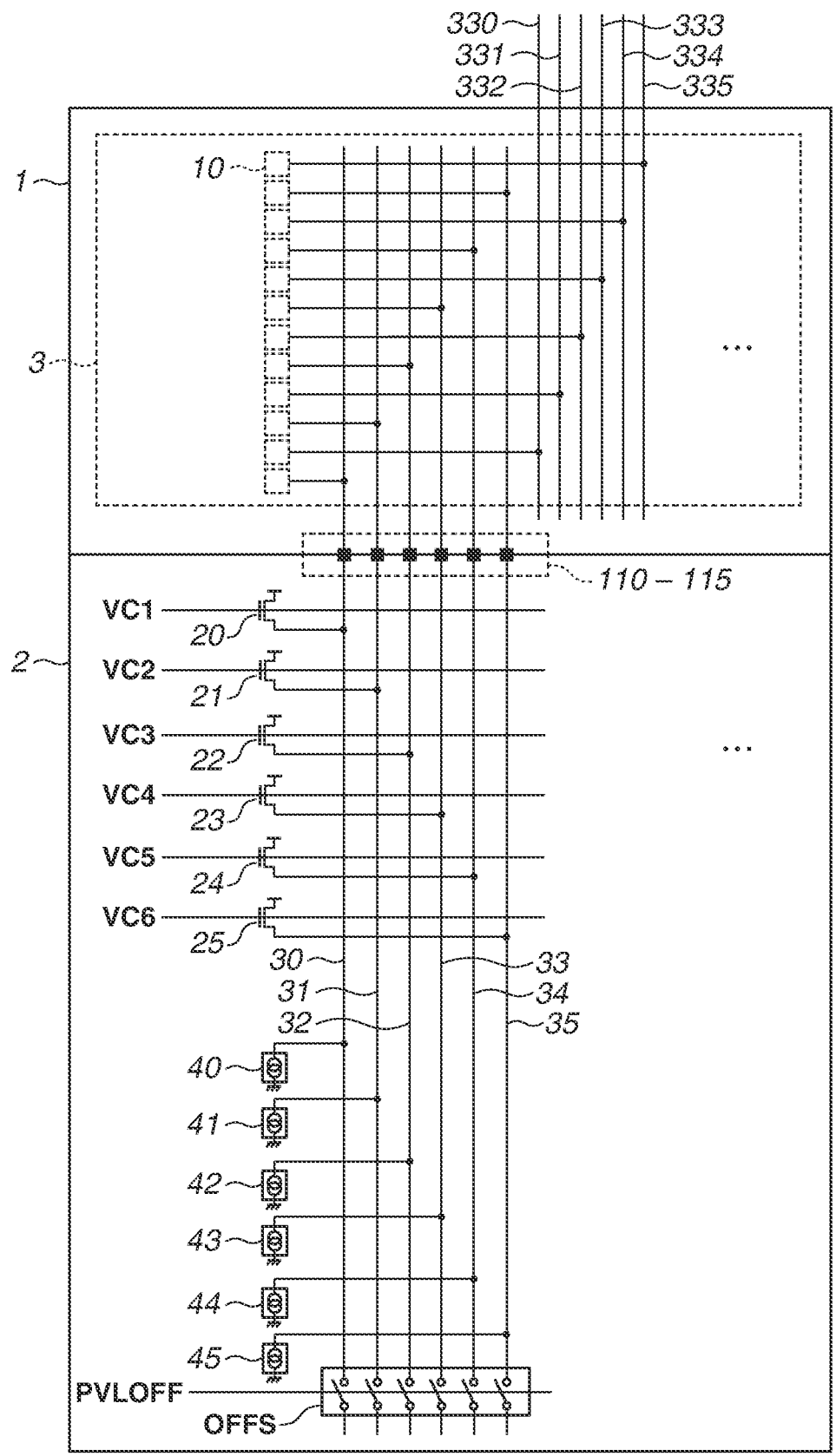
FIG. 5 is a circuit diagram illustrating a configuration of a photoelectric conversion apparatus according to a second exemplary embodiment.

FIG. 5 is a circuit diagram illustrating a photoelectric conversion apparatus according to a second exemplary embodiment of the present disclosure. A difference from the first exemplary embodiment will be mainly described below. FIG. 5 illustrates a configuration in which a switch group OFFS including a plurality of switches having functions similar to those of the transistors S1 to S4 illustrated in FIG. 2 is provided.

In the example of FIG. 5, each pixel column includes 12 signal lines 30 to 35 and 330 to 335. Signals to be supplied to the gates of n-type transistors 20 to 25 connected to the signal lines 30 to 35, respectively, are referred to as signals VC1 to VC6, respectively.

With this configuration, a short-circuit between different signal lines in the same pixel column can be detected.

Generally, in a configuration where a plurality of signal lines is provided in each pixel column, a space between the lines is narrower than that in a configuration where a single signal line is provided in each pixel column as illustrated in FIG. 2, so that a short-circuit defect is more likely to occur. With the technique according to the present exemplary embodiment, a short-circuit defect in the second substrate 2 can be detected, which leads to an improvement in the yield of the photoelectric conversion apparatus.

Figure 6:
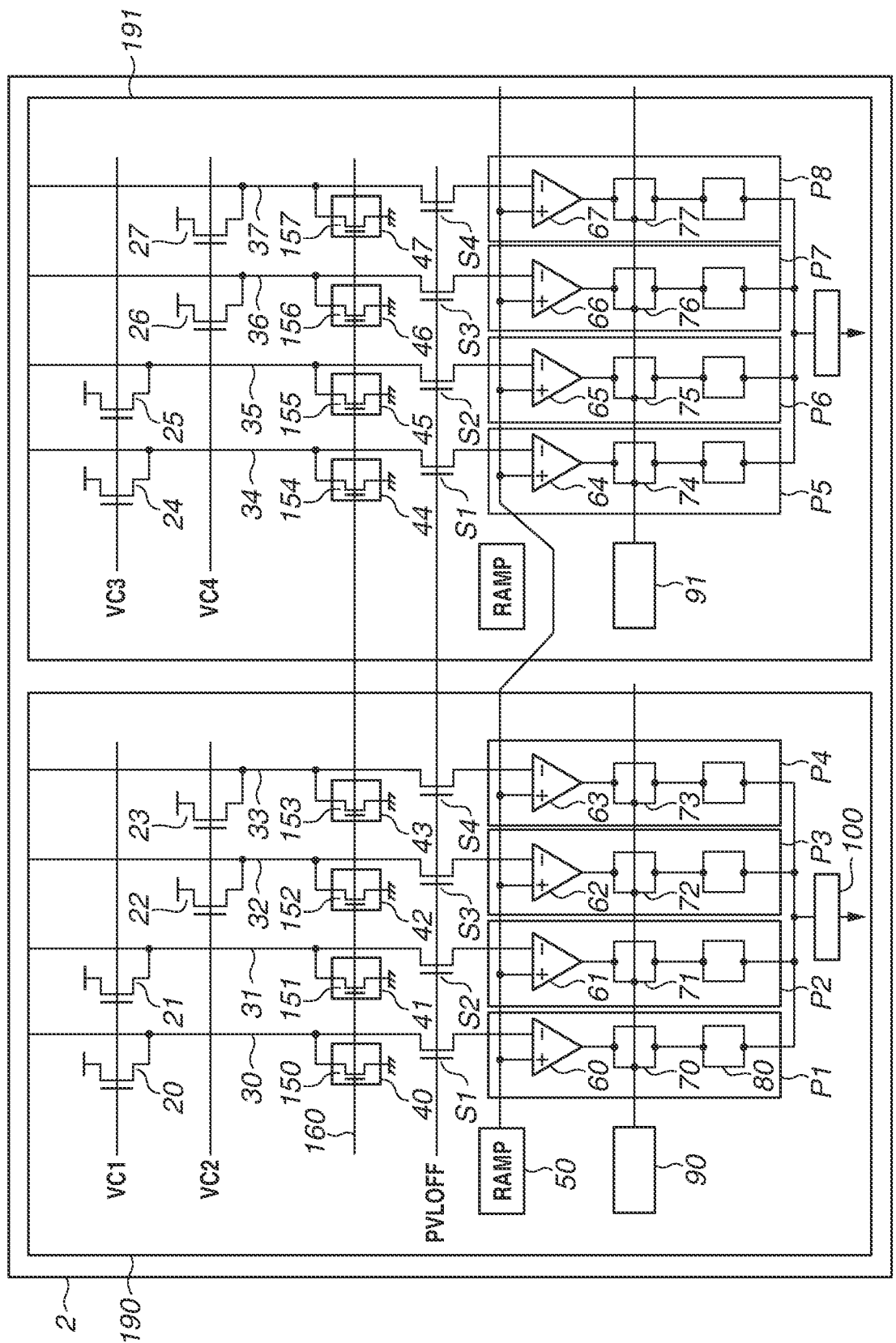
FIG. 6 is a circuit diagram illustrating a configuration of a photoelectric conversion apparatus according to a third exemplary embodiment.
Figure 7:
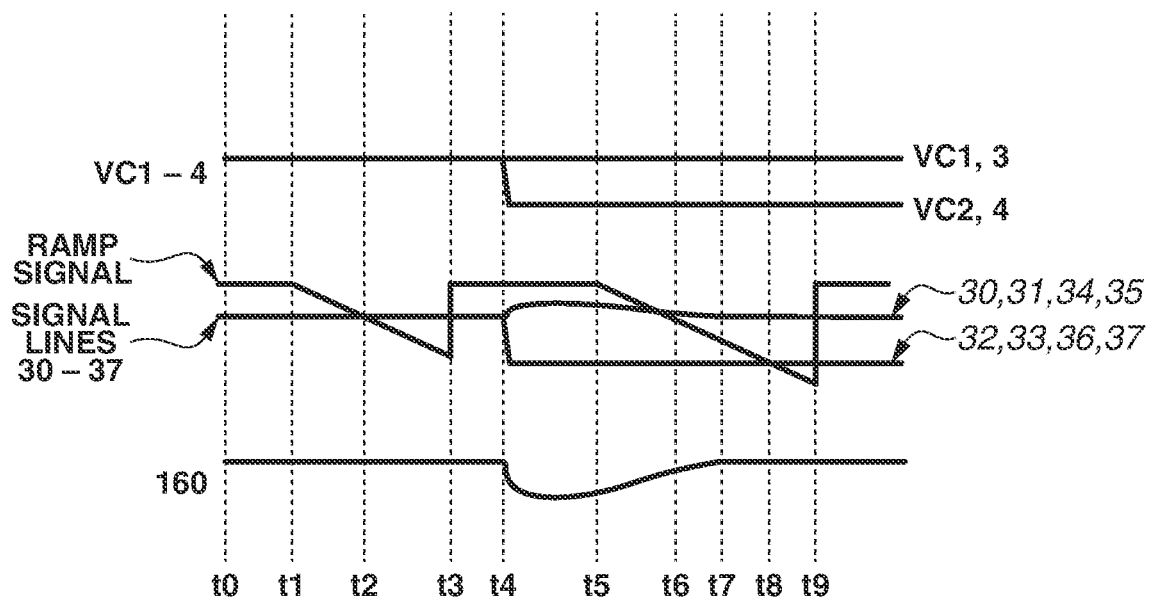
FIG. 7 is a timing diagram illustrating an operation of a second substrate according to the third exemplary embodiment.

FIG. 6 is a circuit diagram illustrating a configuration of a photoelectric conversion apparatus according to a third exemplary embodiment. FIG. 7 is a timing diagram illustrating an operation of the photoelectric conversion apparatus according to the third exemplary embodiment.

A difference from the first exemplary embodiment will be mainly described.

In the present exemplary embodiment, control lines (gate lines) connected to the gates of n-type transistors 20 to 27 are divided every plurality of pixel columns (on a region-by-region basis). With this configuration, not only a defect between the adjacent columns, but also a defect between the columns in a wide range can be detected.

In the example of FIG. 6, the second substrate 2 includes two circuit groups 190 and 191. The second substrate 2 is prepared by performing exposure two separate times using a mask set common to the left half (the circuit group 190) and the right half (the circuit group 191) of the second substrate 2. Thus, the circuit groups 190 and 191 have substantially the same configuration. However, the connection state in each of the circuit groups 190 and 191 can be changed by performing one-shot exposure on an upper metal wiring layer. For example, the ramp signal supply circuit in the circuit group 191 is made unusable and inoperable. On the other hand, the ramp signal generated by the ramp signal supply circuit 50 in the circuit group 190 can be supplied to the circuit group 191. A gate line 160 for current source transistors 150 to 157 in current sources 40 to 47, respectively, can be shared between the circuit groups 190 and 191. With the above configurations, characteristic differences between the circuit group 190 and the circuit group 191 are reduced.

In the present exemplary embodiment, the gate lines for the n-type transistors 20 to 27 are divided every plurality of pixel columns (on a region-by-region basis). With this configuration, it is possible to conduct an inspection for an interference defect not only between the adjacent columns, but also between the columns in a wide range due to shorting or coupling between the signal lines 30 to 37 and the gate line 160. The operation will be described with reference to a timing diagram illustrated in FIG. 7.

At time t0, signals VC1 to VC4 have the same potential. the n-type transistors 20 to 27 and the current sources 40 to 47 form source followers, respectively. The voltage based on the potentials of the signals VC1 to VC4 appears on the signal lines 30 to 37. At time t1, the ramp signal starts a slope operation. At time t2, the voltage of the ramp signal to be input to each of comparators 60 to 67 is equal to the voltage of the signal on the corresponding one of the signal lines 30 to 37, so that the output of each of the comparators 60 to 67 changes. The time taken for the change is measured by counters 90 and 91 and the measured time is held in first memories 70 to 77, thereby performing the AD conversion on the reference level of the signals VC1 to VC4. At time t3, the ramp signal is reset.

At time t4, the voltage of the signals VC2 and VC4 among the signals VC1 to VC4 is decreased. Accordingly, the potential of each of the signal lines 32, 33, 36, and 37 decreases. Consider a case where a large capacitance coupling or a short-circuit defect has occurred between any one of the signal lines 32, 33, 36, and 37 and the gate line 160. If a large capacitance coupling or a short-circuit defect has occurred therebetween, the potential of the gate line 160 temporarily decreases at time t4 in FIG. 7. Accordingly, as the current flowing through the current source transistors 150 to 157 decreases, the potential of each of the signal lines 30, 31, 34, and 35 varies, so that an error occurs compared with a case where no defect occurs at time t6 when the voltage of the signal on each of the signal lines 30, 31, 34, and 35 is equal to the voltage of the ramp signal. The above-described operation makes it possible to detect an abnormality in the output result from each of the signal lines 30 to 37. As a result, the yield of laminated chips can be improved by laminating the first substrate 1 after excluding the defective second substrate 2. For this reason, the gate lines for the n-type transistors 20 to 27 are divided. With this configuration, an interference defect not only between the adjacent columns, but also between the columns in a wide range can be detected, which leads to an improvement in the yield of the photoelectric conversion apparatus.

Although the illustration of the transistors S1 to S4 illustrated in FIG. 2 is omitted in FIG. 6, the transistors S1 to S4 can be provided similarly to the configuration illustrated in FIG. 2. In this case, the transistors S1 to S4 are provided in each of the circuit groups 190 and 191.

Figure 8:
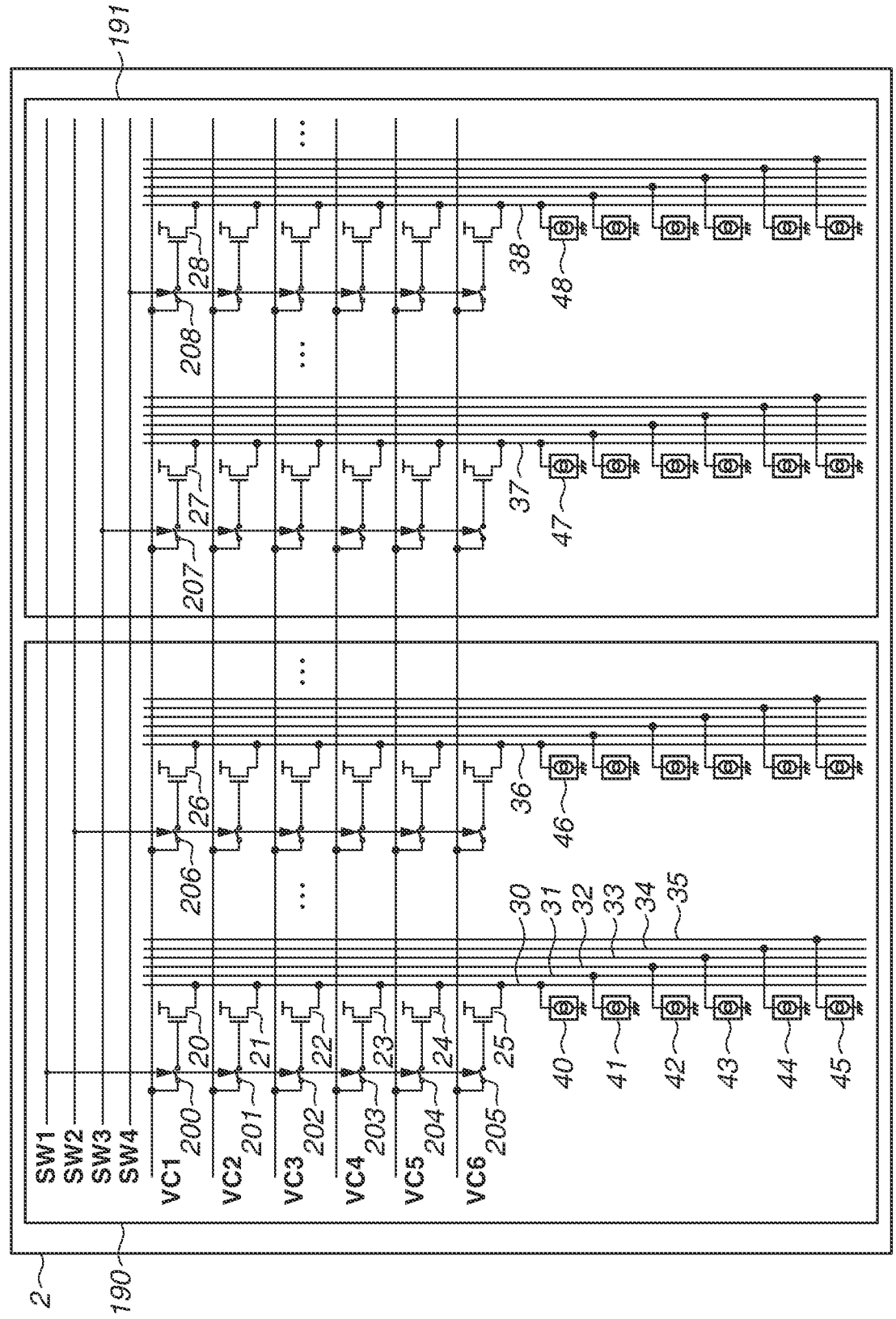
FIG. 8 is a circuit diagram illustrating a configuration of a photoelectric conversion apparatus according to a fourth exemplary embodiment.
Figure 9:
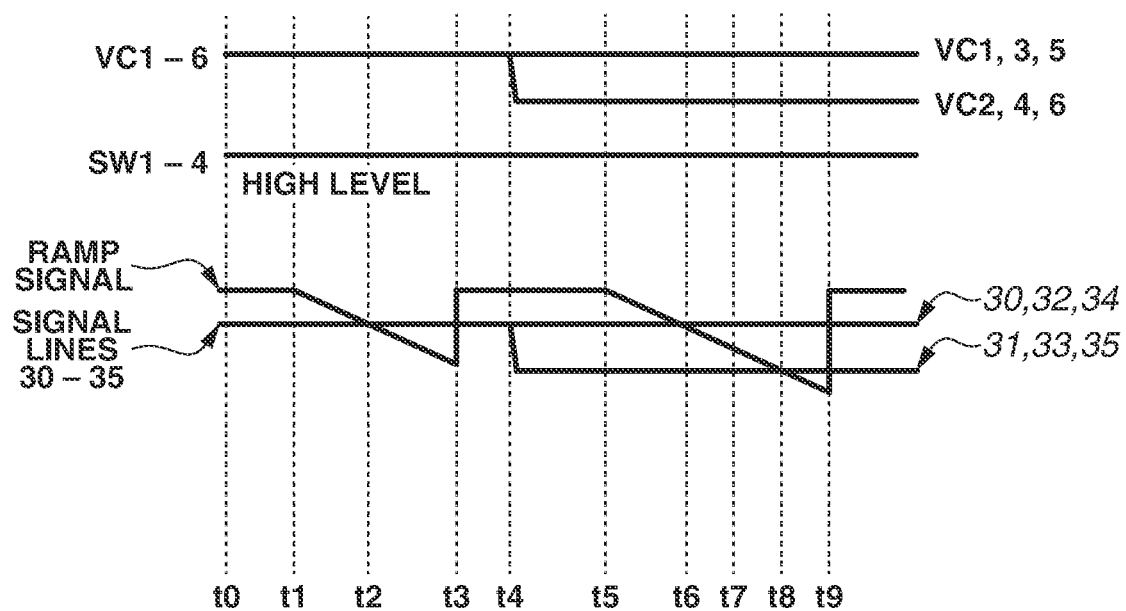
FIG. 9 is a timing diagram illustrating an operation of a second substrate according to the fourth exemplary embodiment.
Figure 10:
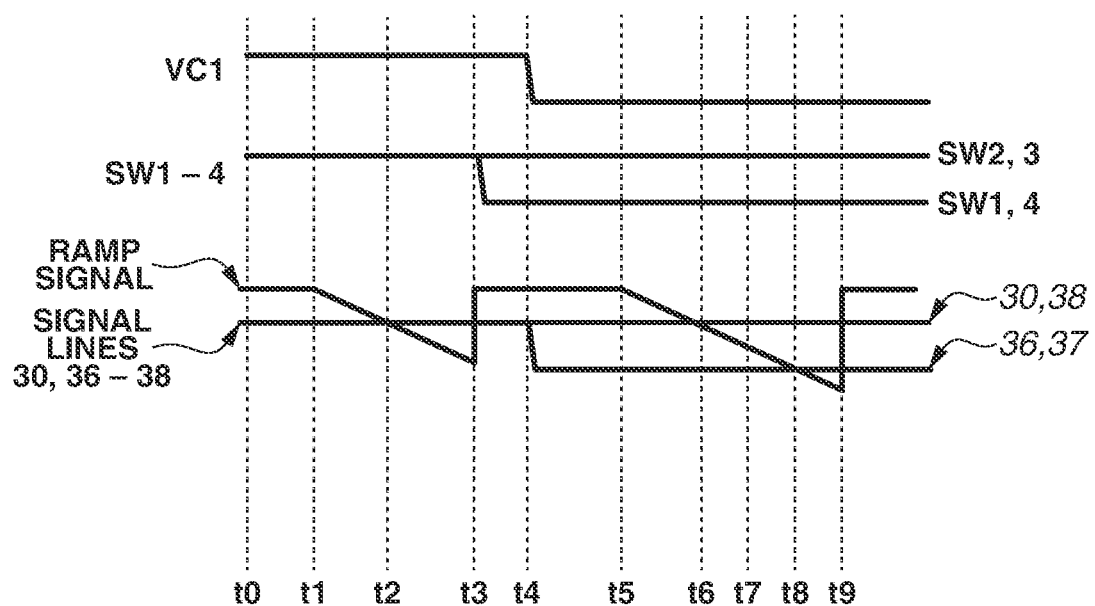
FIG. 10 is a timing diagram illustrating another operation of the second substrate according to the fourth exemplary embodiment.

FIG. 8 is a circuit diagram illustrating a photoelectric conversion apparatus according to a fourth exemplary embodiment. FIGS. 9 and 10 are timing diagrams each illustrating an operation of the photoelectric conversion apparatus according to the fourth exemplary embodiment. A difference from the third exemplary embodiment will be mainly described below.

As illustrated in FIG. 8, the photoelectric conversion apparatus includes the signal lines 30 to 35, and six signal lines (e.g., the signal lines 30 to 35) are provided in each column.

The photoelectric conversion apparatus also includes switches 200 to 205. Switches 206, 207, and 208 and n-type transistors 26, 27, and 28 are provided in respective columns in other regions. In the present exemplary embodiment, an inspection for an interference defect between the columns in a wide range can be conducted similarly to the example of FIG. 6, and an inspection for a short-circuit defect between the signal lines 30 to 35 in the same column can also be conducted similarly to the example of FIG. 4. Furthermore, an increase in the number of control lines to be used can be suppressed.

Detection of a short-circuit between the signal lines 30 to 35 will now be described with reference to FIG. 9. At time t0, signals VC1 to VC6 have the same potential, and signals SW1 to SW4 are at a high level. When the switches 200 to 205 are turned on, the signals VC1 to VC6 are supplied to the gates of the n-type transistors 20 to 25, respectively. The n-type transistors 20 to 25 and the current sources 40 to 45 form source followers, respectively, and the voltage based on the signals VC1 to VC6 appears on the signal line 30 to 35. At time t1, the ramp signal starts a slope operation. At time t2, the voltage of the ramp signal to be input to each comparator is equal to the voltage of the signal on the corresponding one of the signal lines 30 to 35, so that the output of each comparator changes. The time taken for the change is measured, thereby performing the AD conversion on the reference level of the signals VC1 to VC6. At time t3, the ramp signal is reset.

At time t4, the voltage of the signals VC2, VC4, and VC6 among the signals VC1 to VC6 is decreased. Accordingly, the signal lines 31, 33, and 35 are set to have different potentials from those of the signal lines 30, 32, and 34.

This makes it possible to detect a short-circuit defect and leads to an improvement in the yield of the photoelectric conversion apparatus, similarly to the first and second exemplary embodiments.

Next, an inspection for an interference defect between the columns in a wide range will be described with reference to FIG. 10.

At time t0, the signal VC1 is set to a high voltage. The signals SW1 to SW4 are at the high level and the switches 200 and 206 to 208 are turned on, so that the signal VC1 is supplied to the gate of each of the n-type transistors 20 and 26 to 28. The n-type transistors 20 and 26 to 28 and the current sources 40 and 46 to 48 form source followers, respectively, and the voltage based on the signal VC1 appears on the signal lines 30 and 36 to 38. At time t1, the ramp signal starts a slope operation. At time t2, the voltage of the ramp signal to be input to each comparator is equal to the voltage of the signal on the corresponding one of the signal lines 30 and 36 to 38, so that the output of each comparator changes. The time taken for the change is measured, thereby performing the AD conversion on the reference level of the signal VC1. At time t3, the ramp signal is reset. At time t3, the signals SW1 and SW4 among the signals SW1 to SW4 are set to a low level. Accordingly, the switches 200 and 208 are turned off, and the potential of the gate of each of the n-type transistors 20 and 28 is held at the potential of the signal VC1 at time t3. When the voltage of the signal VC1 is decreased at time t4, the potential of each of the signal lines 30 and 38 does not change and the potential of each of the signal lines 36 and 37 decreases. In this way, different signals can be applied to signal lines in separate regions, similarly to the example of FIG. 7. This configuration makes it possible to inspect an interference defect between the columns in a wide range, which leads to an improvement in the yield of the photoelectric conversion apparatus.

In the present exemplary embodiment, the above-described two operations are implemented by using a total of ten lines, i.e., lines for the signals VC1 to VC6 and the signals SW1 to SW4, which are less than 24 lines to be used when the gates of all the n-type transistors are simply separated.

Figure 11:
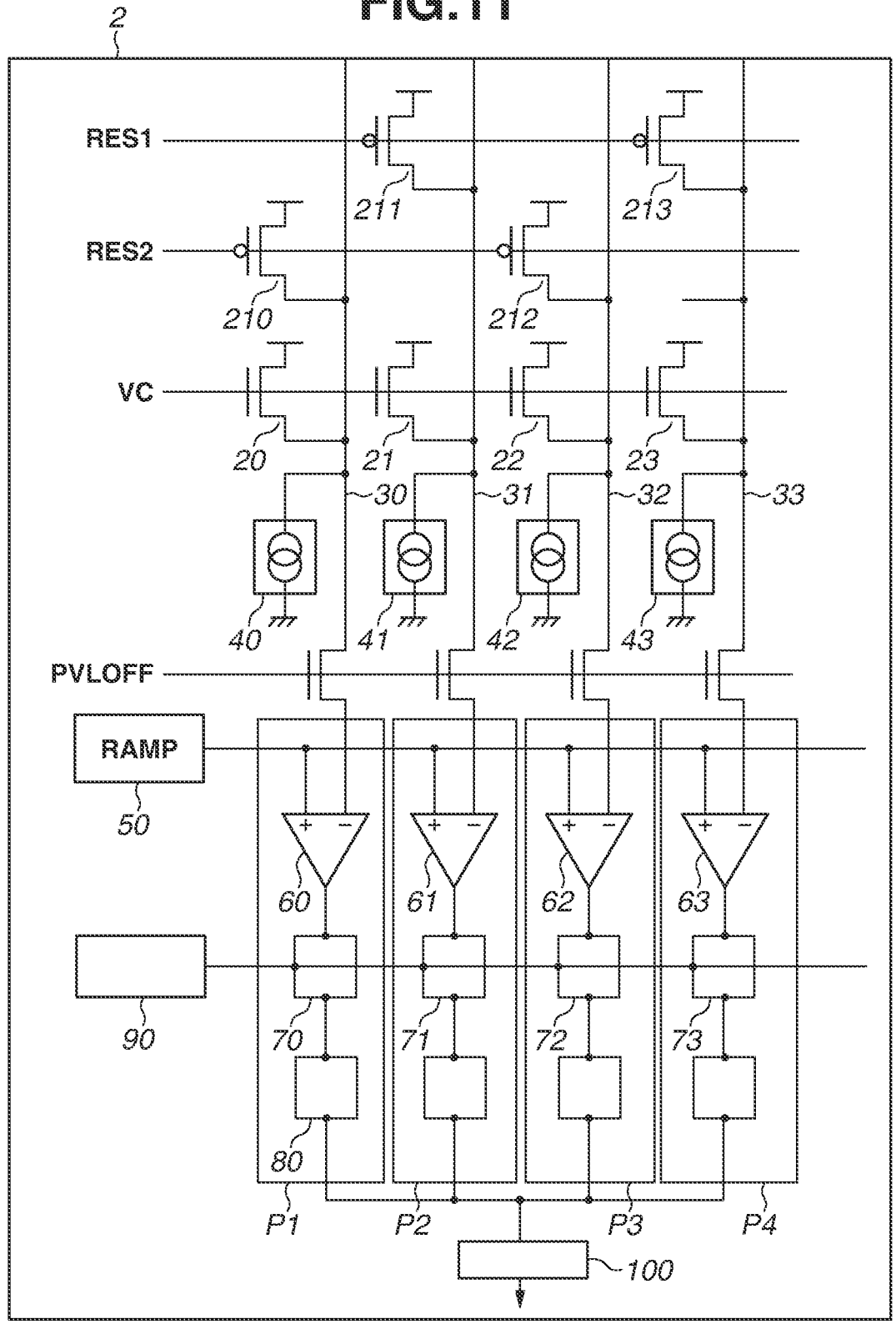
FIG. 11 is a circuit diagram illustrating a configuration of a photoelectric conversion apparatus according to a fifth exemplary embodiment.
Figure 12:
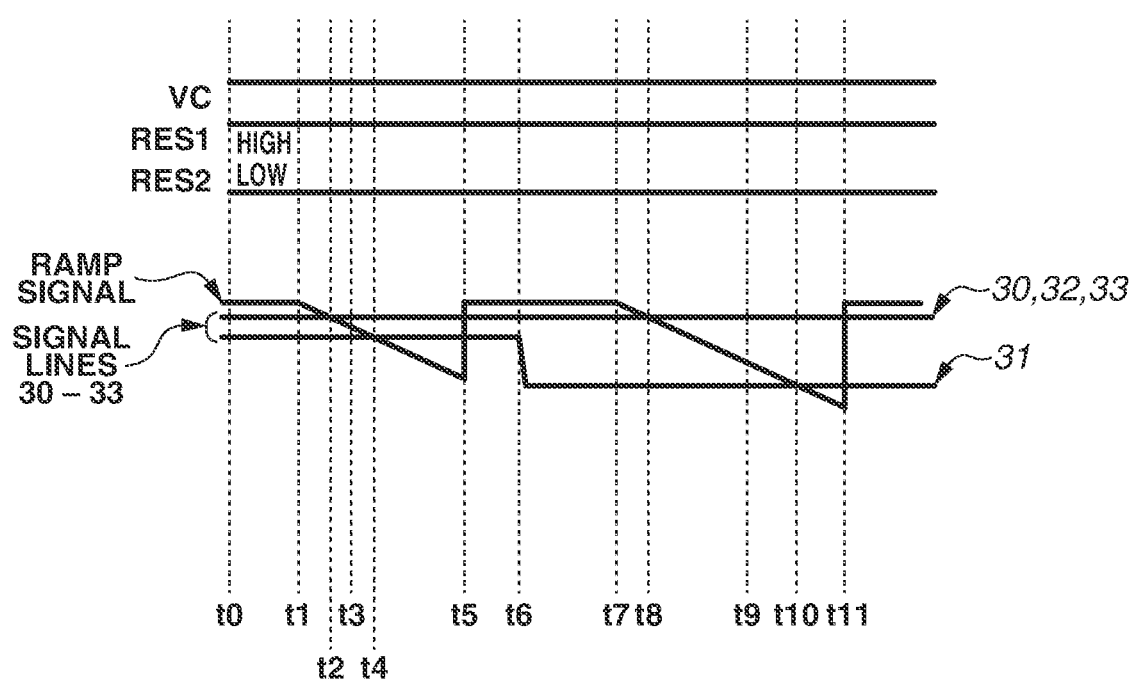
FIG. 12 is a timing diagram illustrating an operation of a second substrate according to the fifth exemplary embodiment.

FIG. 11 is a circuit diagram illustrating a photoelectric conversion apparatus according to a fifth exemplary embodiment. FIG. 12 is a timing diagram illustrating an operation of the photoelectric conversion apparatus according to the fifth exemplary embodiment. A difference between the second substrate 2 according to the present exemplary embodiment and the second substrate 2 according to the first exemplary embodiment will be mainly described below. In the example of FIG. 11, a gate line is shared among the n-type transistors 20 to 23, and p-type transistors 210 to 213 are provided. In other words, the p-type transistors 210 to 213 are provided as transistors of a second conductivity type different from a first conductivity type of the n-type transistors 20 to 23. Two gate lines for transmitting a signal RES1 and a signal RES2 are provided for the p-type transistors 210 to 213. With this configuration, power consumption during the inspection can be reduced.

The operation will be described with reference to FIG. 12. At time t0, the signal RES1 is at a high level and the signal RES2 is at a low level. Accordingly, the p-type transistors 211 and 213 are turned off and the p-type transistors 210 and 212 are turned on. The n-type transistors 21 and 23 and the current sources 41 and 43 form source followers, respectively, and the voltage based on the signal VC appears on the signal lines 31 and 33. On the other hand, the voltage on each of the signal lines 30 and 32 is fixed at the power supply voltage in a normal state. Consider a case where a short-circuit defect occurs between the signal line 32 and the signal line 33. In this case, the voltage on the signal line 33 is also fixed at the power supply voltage as illustrated in FIG. 12. This operation makes it possible to detect an abnormality in the output result from the signal line 33 and to detect a short-circuit defect between the signal lines 32 and 33. As a result, the yield of laminated chips can be improved by laminating the first substrate 1 after excluding the defective second substrate 2. Therefore, the configuration in which separate gate lines are provided for the p-type transistors 210 to 213 makes it possible to detect a short-circuit defect, which leads to an improvement in the yield of the photoelectric conversion apparatus.

FIG. 13 is a circuit diagram illustrating a photoelectric conversion apparatus according to a sixth exemplary embodiment. A difference between the second substrate 2 according to the sixth exemplary embodiment and the second substrate 2 according to the fourth and fifth exemplary embodiments will be mainly described below.

As illustrated in FIG. 13, the photoelectric conversion apparatus includes the signal lines 30 to 35, and six signal lines (e.g., the signal lines 30 to 35) are provided in each column. In this configuration, the photoelectric conversion apparatus also includes the n-type transistors 20 to 25 and p-type transistors 210 to 215. In addition, p-type transistors 216 to 218 are provided in respective columns in other regions. Furthermore, a control unit 220 is provided at the center of the circuit group 190, and a control unit 221 is provided at the center of the circuit group 191. In the present exemplary embodiment, similarly to the example of FIG. 8, an inspection for an interference defect between the columns in a wide range and an inspection for a short-circuit defect between the signal lines in the same column can be conducted. Furthermore, an increase in the number of control lines to be used can be suppressed.

In the present exemplary embodiment, for example, signals RES1a to RES1d are set to a low level, signals RES2a to RES2d are set to a high level, and signals RES3a to RES3d are set to a low level. Furthermore, signals RES4a to RES4d are set to a high level, signals RES5a to RES5d are set to a low level, and signals RES6a to RES6d are set to a high level. Accordingly, different signals are supplied to the adjacent lines among the signal lines 30 to 35, thereby making it possible to conduct an inspection for a short-circuit defect between the signal lines 30 to 35 in the same column.

In the present exemplary embodiment, for example, the signals RES1a to RES6a are set to a low level and the signals RES1b to RES6b are set to a high level. Furthermore, the signals RES1c to RES6c are set to a low level and the signals RES1d to RES6d are set to a high level. Accordingly, different signals are supplied to the signal lines 30 and 36 to 38, thereby making it possible to conduct an inspection for an interference defect between the columns in a wide range.

In the present exemplary embodiment, the control unit 220 is provided at the center of the circuit group 190 and the control unit 221 is provided at the center of the circuit group 191, thereby making it possible to suppress an increase in the number of control lines. More specifically, in a circuit region in which the p-type transistor 210 is disposed, six control lines for transmitting the signals RES1a to RES6a are provided. In a circuit region in which the p-type transistor 216 is disposed, six control lines for transmitting the signals RES1b to RES6b are provided. In a circuit region in which the p-type transistor 217 is disposed, six control lines for transmitting the signals RES1c to RES6c are provided. In a circuit region in which the p-type transistor 218 is disposed, six control lines for transmitting signals RES1d to RES6d are provided. In this manner, the provision of six control lines in each circuit region makes it possible to conduct two types of inspections, i.e., an inspection for an interference defect and an inspection for a short-circuit defect.

Figure 14A:
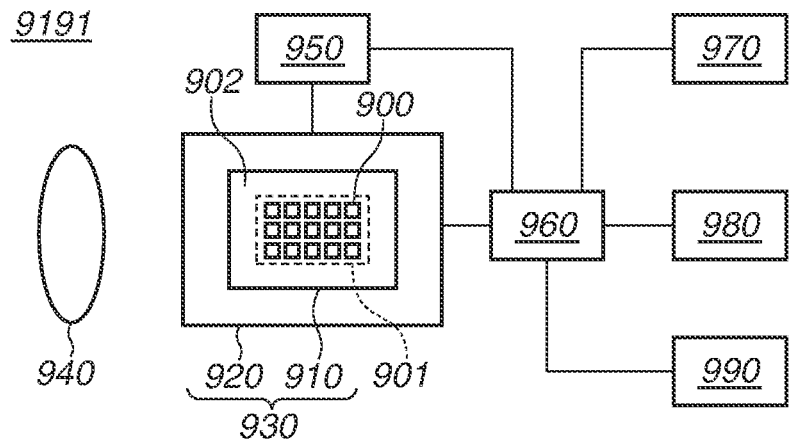
FIG. 14A is a diagram illustrating a configuration of equipment according to a seventh exemplary embodiment.

Equipment according to a seventh exemplary embodiment is applicable to the photographic conversion apparatus according to any of the first to sixth exemplary embodiments. FIG. 14A is a schematic diagram illustrating equipment 9191 including a semiconductor apparatus 930 according to the present exemplary embodiment. The equipment 9191 including the semiconductor apparatus 930 will be described in detail. The semiconductor apparatus 930 can include not only a semiconductor device 910 including a semiconductor layer, but also a package 920 that accommodates the semiconductor device 910. The package 920 can include a base to which the semiconductor device 910 is fixed, and a lid, such as glass, that faces the semiconductor device 910. The package 920 can further include bonding members, such as bonding wires and bumps, for connecting terminals provided on the base with terminals provided on the semiconductor device 910.

The equipment 9191 can include at least one of an optical apparatus 940, a control apparatus 950, a processing apparatus 960, a display apparatus 970, a storage apparatus 980, or a mechanical apparatus 990. The optical apparatus 940 corresponds to the semiconductor apparatus 930. The optical apparatus 940 is, for example, a lens, a shutter, or a mirror. The control apparatus 950 controls the semiconductor apparatus 930. The control apparatus 950 is, for example, a semiconductor apparatus such as an application-specific integrated circuit (ASIC).

The processing apparatus 960 processes a signal output from the semiconductor apparatus 930. The processing apparatus 960 is a semiconductor apparatus, such as a central processing unit (CPU) or an ASIC, that is used to form an analog front-end (AFE) or a digital front-end (DFE). The display apparatus 970 is an electroluminescence (EL) display apparatus or a liquid crystal display apparatus for displaying information (an image) obtained by the semiconductor apparatus 930. The storage apparatus 980 is a magnetic device or a semiconductor device that stores information (an image) obtained by the semiconductor apparatus 930. The storage apparatus 980 is a volatile memory, such as a static RAM (SRAM) or DRAM, or a nonvolatile memory such as a flash memory or a hard disk drive.

The mechanical apparatus 990 includes a movable unit or a propelling unit such as a motor or an engine. In the equipment 9191, the signal output from the semiconductor apparatus 930 is displayed on the display apparatus 970 and is transmitted to the outside by a communication apparatus (not illustrated) included in the equipment 9191. Thus, the equipment 9191 may desirably include the storage apparatus 980 and the processing apparatus 960, in addition to a storage circuit and an arithmetic circuit included in the semiconductor apparatus 930. The mechanical apparatus 990 may be controlled based on the signal output from the semiconductor apparatus 930.

The equipment 9191 is suitable for an electronic apparatus such as an information terminal (e.g., a smartphone or a wearable terminal) including an image capturing function, or a camera (e.g., a lens-interchangeable camera, a compact camera, a video camera, or a monitoring camera). The mechanical apparatus 990 in a camera can drive components of the optical apparatus 940 for zooming, focusing, or shutter operation. Alternatively, the mechanical apparatus 990 in the camera can move the semiconductor apparatus 930 for an image stabilization operation.

The equipment 9191 can be transportation equipment such as a vehicle, a ship, or a flight vehicle. The mechanical apparatus 990 in transportation equipment can be used as a moving apparatus. The equipment 9191 serving as transportation equipment is suitable for equipment that transports the semiconductor apparatus 930, or equipment that assists and/or automates driving (manipulation) using the image capturing function. The processing apparatus 960 for assisting and/or automating driving (manipulation) can perform processing for operating the mechanical apparatus 990 serving as the moving apparatus based on information obtained by the semiconductor apparatus 930. Alternatively, the equipment 9191 may be medical equipment such as an endoscope, measuring equipment such as a ranging sensor, analysis equipment such as an electronic microscope, office equipment such as a copying machine, or industrial equipment such as a robot.

According to the above-described exemplary embodiments, excellent pixel characteristics can be obtained. Therefore, the value of the semiconductor apparatus can be increased. The increase in value described herein corresponds to at least one of addition of functions, enhancement in performance, improvement in characteristics, improvement in reliability, improvement in yield, reduction in environmental load, reduction in cost, downsizing, or reduction in weight.

Using the semiconductor apparatus 930 according to the present exemplary embodiment for the equipment 9191 makes it also possible to increase the value of the equipment 9191. For example, the semiconductor apparatus 930 mounted on transportation equipment provides excellent performance in capturing an image of the outside of the transportation equipment or measuring the outside environment. Thus, the decision made to mount the semiconductor apparatus 930 according to the present exemplary embodiment on transportation equipment is advantageous in increasing the performance of the transportation equipment. In particular, the semiconductor apparatus 930 is suitably used in performing driving assistance and/or automatic driving of transportation equipment using information obtained by the semiconductor apparatus 930.

A photoelectric conversion system and a moving body according to the present exemplary embodiment will be described with reference to FIGS. 14B and 14C, respectively.

Figure 14B:
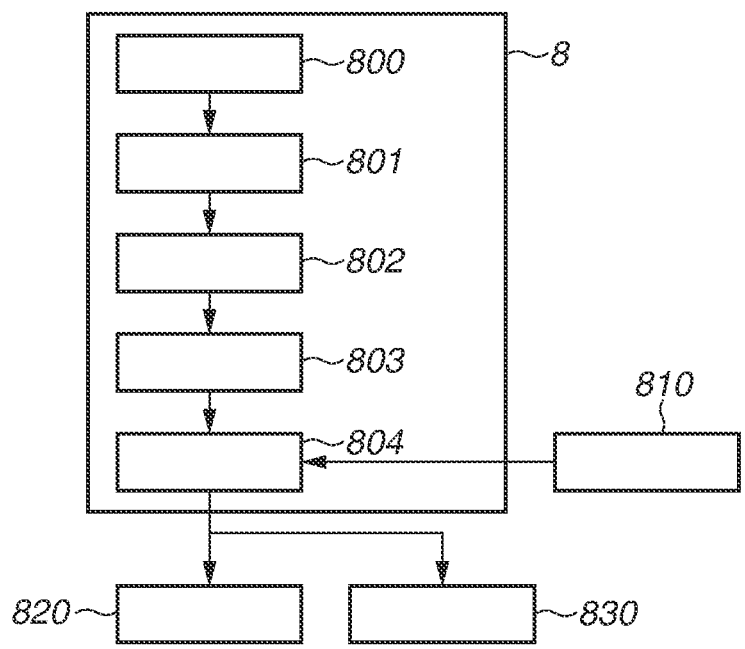
FIG. 14B is a diagram illustrating a configuration of a photoelectric conversion system according to the seventh exemplary embodiment.
Figure 14C:
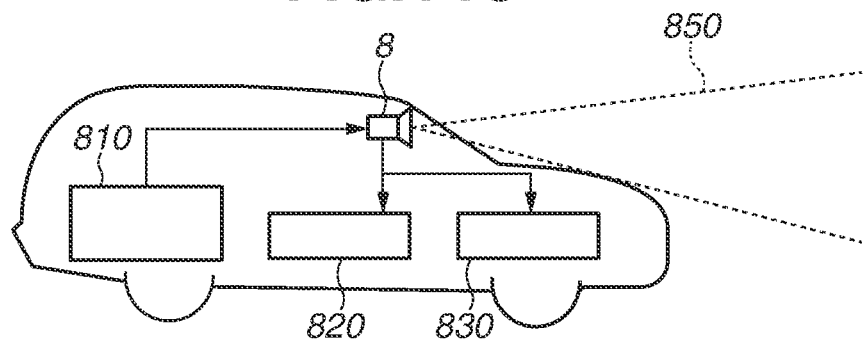
FIG. 14C is a diagram illustrating a configuration of a moving body according to the seventh exemplary embodiment.

FIG. 14B illustrates a photoelectric conversion system 8 for an on-vehicle camera as an example of the photoelectric conversion system. The photoelectric conversion system 8 has a photoelectric conversion apparatus 800. The photoelectric conversion apparatus 800 is the photoelectric conversion apparatus (the imaging apparatus) described in any of the above-described exemplary embodiments. The photoelectric conversion system 8 has an image processing unit 801 that performs image processing on a plurality of pieces of image data acquired by the photoelectric conversion apparatus 800, and a parallax acquisition unit 802 that calculates a parallax (a phase difference between parallax images) from a plurality of pieces of image data acquired by the photoelectric conversion system 8. The photoelectric conversion system 8 further includes a distance acquisition unit 803 that calculates a distance to a target object based on the calculated parallax, and a collision determination unit 804 that determines whether there is a possibility of collision based on the calculated distance. The parallax acquisition unit 802 and the distance acquisition unit 803 are examples of a distance information acquisition unit that acquires distance information about a distance to a target object. In other words, the distance information is information about a parallax, a defocus amount, a distance to a target object, and the like. The collision determination unit 804 may determine a possibility of collision, using any of these pieces of distance information. The distance information acquisition unit may be implemented by specifically designed hardware or may be implemented by a software module. The distance information acquisition unit may also be implemented by a device such as a field programmable gate array (FPGA) or an application specific integrated circuit (ASIC) or may be implemented by the combination of these.

The photoelectric conversion system 8 is connected to a vehicle information acquisition apparatus 810, and is capable of acquiring vehicle information such as a vehicle speed, a yaw rate, and a steering angle. The photoelectric conversion system 8 is also connected to a control engine control unit (ECU) 820 that outputs a control signal for applying a braking force to a vehicle, based on a result of the determination by the collision determination unit 804. The photoelectric conversion system 8 is also connected to an alarm apparatus 830 that issues an alarm to a driver based on the result of the determination by the collision determination unit 804. For example, in a case where there is a high possibility of collision based on the result of the determination by the collision determination unit 804, the control ECU 820 performs vehicle control to avoid a collision or reduce damage by, for example, applying brakes, releasing an accelerator, or restraining engine power. The alarm apparatus 830 warns a user by, for example, generating an alarm sound, displaying alarm information on a screen of a navigation system, or applying vibrations to a seat belt or a steering wheel.

In the present exemplary embodiment, the photoelectric conversion system 8 images an area around the vehicle such as a front side or a rear side of the vehicle. FIG. 14C illustrates the photoelectric conversion system 8 in a case where the front side of the vehicle (an imaging range 850) is imaged. The vehicle information acquisition apparatus 810 transmits an instruction to the photoelectric conversion system 8 or the photoelectric conversion apparatus 800. This configuration can improve the accuracy of ranging.

While the example of control for avoiding a collision with another vehicle is described above, the present exemplary embodiment is also applicable to control for automated driving to follow another vehicle, and control for automated driving not to stray from a traffic lane. Furthermore, the photoelectric conversion system 8 is not limited to the vehicle such as an automobile, and is applicable to, for example, a moving body (a moving apparatus) such as a ship, an airplane, or an industrial robot. In addition, the photoelectric conversion system is applicable to not only the moving body, but also an apparatus that widely uses object recognition, such as an intelligent transport system (ITS).

The present disclosure is not limited to the above-described exemplary embodiments and can be modified in various ways.

For example, the configuration of the pixels 10 is not limited to the configuration illustrated in FIG. 3. The capacitance of the floating diffusion 420 may be configured to be switched. Each of the pixels 10 may be configured to share the floating diffusion 420 between a plurality of photodiodes 400 and 401. Each of the pixels 10 may include the plurality of photodiodes 400 and 401 below a microlens and may be configured as a pixel capable of detecting a phase difference. If a plurality of the signal lines 30 is provided in each pixel column, a plurality of the selection transistors 440 may be provided. A transistor and a holding capacitor may be further provided on an electrical path between the photodiode 400 and the transfer transistor 410, thereby providing a global shutter function.

As the photoelectric conversion unit included in each of the pixels 10, the configuration of the photodiode 400 in which an electric charge is accumulated is described above by way of example. However, the photoelectric conversion unit is not limited thereto. For example, an avalanche photodiode for performing an avalanche multiplication may be used. In the case of using the avalanche photodiode, a single-photon counting format or a single photon avalanche diode (SPAD) may be used. In the case of using the SPAD, the avalanche photodiode is provided on the first substrate 1. A quench element for controlling the avalanche multiplication of the avalanche photodiode, a waveform shaping circuit (an inverter) supplied with an output from the avalanche photodiode, and a counter for counting output pulses from the waveform shaping circuit are provided on the second substrate 2. The counting result obtained by the counter is obtained as a digital signal corresponding to the amount of light incident on the avalanche photodiode. In this case, the plurality of signal processing circuits P1 to P4 each includes the waveform shaping circuit and the counter. The first substrate 1 and the second substrate 2 are electrically connected by bonding the bonding portion included in the first substrate 1 connected to the avalanche photodiode with the bonding portion (the input portion) included in the second substrate 2 connected to the waveform shaping circuit. The n-type transistor 20 that supplies the predetermined voltage as described above is connected between the waveform shaping circuit and the corresponding input portion.

With this configuration, the second substrate 2 can be inspected in a similar manner to the above-described exemplary embodiments. In addition, an inspection for an interference defect and an inspection for a short-circuit defect can also be performed.

The comparator 60 may further include a capacitor and a switch for setting a comparator operating point, i.e., a capacitor and a switch for performing an auto-zero operation.

An example in which a part of the configuration according to any of the exemplary embodiments is added to any of the other exemplary embodiments, and an example in which a part of the configuration according to any of the exemplary embodiments is replaced with a part of the configuration according to any of the other exemplary embodiments are also included in the exemplary embodiments of the present disclosure.

The above-described exemplary embodiments are merely examples for carrying out the present disclosure, and the technical scope of the present disclosure shall not be interpreted in a limited manner by the exemplary embodiments. The exemplary embodiments of the present disclosure can be carried out in various forms without departing from the technical idea or main features of the present disclosure.

The above-described exemplary embodiments can be modified as appropriate without departing from the technical idea of the present disclosure.

The disclosed contents of the present specification include not only the matters described in the present specification, but also all matters that can be understood based on the present specification and the attached drawings. The disclosed contents of the present specification include complementary sets of concepts described in the present specification. For example, if there is a description about a case where "A is larger than B" in the present specification, it can be said that the present specification discloses a case where "A is not larger than B", even if a description about the case where "A is not larger than B" is omitted. This is because it is assumed that the description about the case where "A is larger than B" takes into consideration the case where "A is not larger than B".

According to the exemplary embodiments of the present disclosure, it is possible to improve the yield of a semiconductor apparatus.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-063495, filed Apr. 2, 2021, which is hereby incorporated by reference herein in its entirety.

What is claimed is:

1. A circuit substrate to be laminated on another substrate, the circuit substrate comprising:
   a plurality of signal lines;
   a plurality of input portions respectively connected to the plurality of signal lines, and each configured to receive a signal from an outside of the circuit substrate;
   a plurality of signal processing circuits respectively connected to the plurality of input portions via the plurality of signal lines;
   a plurality of transistors configured to supply a predetermined voltage to the plurality of signal lines in a state where no signal is input to the plurality of input portions from the outside,
   a plurality of current sources respectively connected to the plurality of signal lines; and
   a plurality of second transistors each configured to switch a conductive state and a non-conductive state of an electrical path between a corresponding one of the plurality of input portions and a corresponding one of the plurality of signal processing circuits, the plurality of second transistors being respectively connected to the plurality of signals lines,
   wherein a part of the plurality of transistors is connected to a first control line, and another part of the plurality of transistors is connected to a second control line different from the first control line, wherein one node of each of the plurality of second transistors is connected to a corresponding one of the plurality of transistors and a corresponding one of the plurality of current sources, and
   wherein another node of each of the plurality of second transistors is connected to the corresponding one of the plurality of signal processing circuits.

2. The circuit substrate according to claim 1, wherein each of the plurality of signal processing circuits includes an analog-to-digital (AD) conversion unit configured to convert the predetermined voltage supplied from a corresponding one of the plurality of transistors into a digital signal.

3. The circuit substrate according to claim 2, wherein the digital signal generated by each of the plurality of signal processing circuits is output to the outside of the circuit substrate.

4. The circuit substrate according to claim 2, further comprising a circuit configured to compare the digital signal with an expected value.

5. The circuit substrate according to claim 4, wherein the circuit outputs, to the outside of the circuit substrate, a signal indicating that a difference between the digital signal and the expected value is detected as being greater than a predetermined amount.

6. The circuit substrate according to claim 1, wherein a power supply voltage is supplied to one of main nodes of each of the plurality of transistors, and the plurality of transistors serves as switches configured to switch between supplying and not supplying, to the plurality of signal lines, the predetermined voltage based on the power supply voltage.

7. The circuit substrate according to claim 1, wherein each of the plurality of transistors is configured to perform a source follower operation with a corresponding one of the plurality of current sources.

8. The circuit substrate according to claim 1, wherein signals output from a plurality of pixels each including a photoelectric conversion unit are input to the plurality of input portions, the plurality of pixels being arranged in a plurality of rows and a plurality of columns on the other substrate, and
   wherein at least two of the plurality of input portions are provided corresponding to pixels in one of the plurality of columns.

9. The circuit substrate according to claim 1, wherein each of the plurality of signal processing circuits includes a waveform shaping circuit and a counter that are configured to process a signal output from an avalanche photodiode provided on the other substrate.

10. The circuit substrate according to claim 1, wherein the circuit substrate is manufactured by a manufacturing apparatus different from a manufacturing apparatus for the other substrate.

11. The circuit substrate according to claim 10, wherein the circuit substrate is manufactured by the manufacturing apparatus with a finer process rule than a process rule of the manufacturing apparatus for the other substrate.

12. A semiconductor apparatus comprising:
    the circuit substrate according to claim 1,
    wherein the circuit substrate and the other substrate are laminated.

13. Equipment comprising:
    the semiconductor apparatus according to claim 12,
    wherein the equipment further comprises at least one of:
    an optical apparatus corresponding to the semiconductor apparatus;
    a control apparatus configured to control the semiconductor apparatus;
    a processing apparatus configured to process a signal output from the semiconductor apparatus;
    a display apparatus configured to display information obtained by the semiconductor apparatus;
    a storage apparatus configured to store the information obtained by the semiconductor apparatus; or
    a mechanical apparatus configured to operate based on the information obtained by the semiconductor apparatus.

14. A circuit substrate to be laminated on another substrate, the circuit substrate comprising:
    a plurality of signal lines;
    a plurality of input portions respectively connected to the plurality of signal lines, and each configured to receive a signal from an outside of the circuit substrate;
    a plurality of signal processing circuits respectively connected to the plurality of input portions via the plurality of signal lines;
    a plurality of transistors configured to supply a predetermined voltage to the plurality of signal lines in a state where no signal is input to the plurality of input portions from the outside, and
    a plurality of third transistors respectively connected to the plurality of signal lines, and each configured to switch between supplying and not supplying a second voltage different from the predetermined voltage,
    wherein a part of the plurality of transistors is connected to a first control line, and another part of the plurality of transistors is connected to a second control line different from the first control line, wherein each of the plurality of transistors is a transistor of a first conductivity type, and wherein each of the plurality of third transistors is a transistor of a second conductivity type different from the first conductivity type.

15. The circuit substrate according to claim 14, wherein each of the plurality of signal processing circuits includes an analog-to-digital (AD) conversion unit configured to convert the predetermined voltage supplied from corresponding one of the plurality of transistors into a digital signal.

16. The circuit substrate according to claim 15, wherein the digital signal generated by each of the plurality of signal processing circuits is output to the outside of the circuit substrate.

17. The circuit substrate according to claim 15, further comprising a circuit configured to compare the digital signal with an expected value.

18. The circuit substrate according to claim 17, wherein the circuit outputs, to the outside of the circuit substrate, a signal indicating that a difference between the digital signal and the expected value is detected as being greater than a predetermined amount.

19. The circuit substrate according to claim 14, wherein a power supply voltage is supplied to one of main nodes of each of the plurality of transistors, and the plurality of transistors serves as switches configured to switch between supplying and not supplying, to the plurality of signal lines, the predetermined voltage based on the power supply voltage.

20. The circuit substrate according to claim 14, further comprising a plurality of current sources respectively connected to the plurality of signal lines, wherein each of the plurality of transistors is configured to perform a source follower operation with corresponding one of the plurality of current sources.

21. The circuit substrate according to claim 14, wherein signals output from a plurality of pixels each including a photoelectric conversion unit are input to the plurality of input portions, the plurality of pixels being arranged in a plurality of rows and a plurality of columns on the other substrate, and wherein at least two of the plurality of input portions are provided corresponding to pixels in one of the plurality of columns.

22. The circuit substrate according to claim 14, wherein each of the plurality of signal processing circuits includes a waveform shaping circuit and a counter that are configured to process a signal output from an avalanche photodiode provided on the other substrate.

23. The circuit substrate according to claim 14, wherein the circuit substrate is manufactured by a manufacturing apparatus different from a manufacturing apparatus for the other substrate.

24. The circuit substrate according to claim 23, wherein the circuit substrate is manufactured by the manufacturing apparatus with a finer process rule than a process rule of the manufacturing apparatus for the other substrate.

25. A semiconductor apparatus comprising:

the circuit substrate according to claim 14, wherein the circuit substrate and the other substrate are laminated.

26. Equipment comprising:

the semiconductor apparatus according to claim 25, wherein the equipment further comprises at least one of:

an optical apparatus corresponding to the semiconductor apparatus;

a control apparatus configured to control the semiconductor apparatus;

a processing apparatus configured to process a signal output from the semiconductor apparatus;

a display apparatus configured to display information obtained by the semiconductor apparatus;

a storage apparatus configured to store the information obtained by the semiconductor apparatus; or a mechanical apparatus configured to operate based on the information obtained by the semiconductor apparatus.

* * * * *